US011064280B2

(12) United States Patent
Tong et al.

(10) Patent No.: US 11,064,280 B2
(45) Date of Patent: Jul. 13, 2021

(54) WIRELESS AUDIO SYSTEM AND METHOD FOR WIRELESSLY COMMUNICATING AUDIO INFORMATION USING THE SAME

(71) Applicant: BESTECHNIC (SHANGHAI) CO., LTD., Shanghai (CN)

(72) Inventors: Weifeng Tong, Shanghai (CN); Liang Zhang, Shanghai (CN); Fei Luo, Shanghai (CN); Guanghui Yang, Shanghai (CN); Lei Yang, Shanghai (CN)

(73) Assignee: BESTECHNIC (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/930,329

(22) Filed: May 12, 2020

(65) Prior Publication Data
US 2020/0275185 A1 Aug. 27, 2020

Related U.S. Application Data

(63) Continuation of application No. 16/450,996, filed on Jun. 24, 2019, now Pat. No. 10,798,477, which is a
(Continued)

(30) Foreign Application Priority Data

Nov. 29, 2018 (CN) .......................... 201811444750.2
Dec. 5, 2018 (CN) .......................... 201811479680.4

(51) Int. Cl.
*H04R 1/10* (2006.01)
*G06F 3/16* (2006.01)
(Continued)

(52) U.S. Cl.
CPC ............ *H04R 1/1041* (2013.01); *G06F 3/165* (2013.01); *H03M 13/00* (2013.01); *H04L 1/16* (2013.01);
(Continued)

(58) Field of Classification Search
None
See application file for complete search history.

(56) References Cited

U.S. PATENT DOCUMENTS 10,212,569 B1 * 2/2019 Huang ................. H04W 84/18
2008/0226094 A1 9/2008 Rutschman
(Continued)

*Primary Examiner* — James K Mooney
(74) *Attorney, Agent, or Firm* — Bayes PLLC

(57) ABSTRACT

Embodiments of wireless audio systems and methods for wirelessly communicating audio information are disclosed herein. In one example, a wireless audio system includes a first wireless headphone and a second wireless headphone. The first wireless headphone is configured to receive, from an audio source, audio information using a first type of short-range wireless communication; and in response to successfully receiving the audio information from the audio source, transmit an audio information message including the audio information using a second type of short-range wireless communication different from the first type of short-range wireless communication. The second wireless headphone is configured to receive, from the audio source, the audio information using the first type of short-range wireless communication; receive, from the first wireless headphone, the audio information message using the second type of short-range wireless communication; and in response to at least one of (i) successfully receiving the audio information from the audio source and the first wireless headphone successfully receiving the audio information from the audio source, or (ii) successfully receiving the audio information message from the first wireless headphone, transmit an acknowledgement message to the audio source.

20 Claims, 18 Drawing Sheets

Related U.S. Application Data continuation of application No. 16/244,056, filed on Jan. 9, 2019, now Pat. No. 10,341,758.

(51) Int. Cl.
*H04W 80/02* (2009.01)
*H03M 13/00* (2006.01)
*H04L 1/16* (2006.01)
*H04R 5/033* (2006.01)

(52) U.S. Cl.
CPC ......... *H04R 1/1016* (2013.01); *H04R 1/1091* (2013.01); *H04R 5/033* (2013.01); *H04W 80/02* (2013.01); *H04R 2420/07* (2013.01)

(56) References Cited

U.S. PATENT DOCUMENTS

| | | |
|---|---|---|
| 2012/0058727 A1 | 3/2012 | Cook et al. |
| 2014/0086125 A1 | 3/2014 | Polo et al. |
| 2018/0084456 A1* | 3/2018 | Gostev ................. H04W 84/18 |
| 2019/0044576 A1 | 2/2019 | Thoen et al. |
| 2019/0104424 A1 | 4/2019 | Hariharan et al. |

* cited by examiner

WIRELESS AUDIO SYSTEM AND METHOD FOR WIRELESSLY COMMUNICATING AUDIO INFORMATION USING THE SAME

CROSS-REFERENCE TO RELATED APPLICATIONS

This application is a continuation of U.S. patent application Ser. No. 16/450,996, filed on Jun. 24, 2019, which is a continuation of U.S. patent application Ser. No. 16/244,056, filed on Jan. 9, 2019, now U.S. Pat. No. 10,341,758, issued on Jul. 2, 2019, which claims the benefits of priorities to Chinese Patent Application No. 201811444750.2 filed on Nov. 29, 2018 and Chinese Patent Application No. 201811479680.4, filed on Dec. 5, 2018, all of which are incorporated herein by reference in their entireties.

BACKGROUND

Embodiments of the present disclosure relate to wireless audio systems.

Loudspeakers, including headphones, have been widely used in daily life. Headphones are a pair of small loudspeaker drivers worn on or around the head over a user's ears, which convert an electrical signal to a corresponding sound.

Wired headphones, however, constrain the users' movement because of the wires (cords), and are particularly inconvenient during exercise. Conventional wireless headphones no longer need the wires between the headphones and the audio sources, but still require the wires between the left and right headphones.

SUMMARY

Embodiments of wireless audio systems and methods for wirelessly communicating audio information are disclosed herein.

In one example, a wireless audio system includes a first wireless headphone and a second wireless headphone. The first wireless headphone is configured to receive, from an audio source, audio information using a first type of short-range wireless communication; in response to successfully receiving the audio information from the audio source, generate an error correcting code based on the audio information; and transmit an error correcting message including the error correcting code without transmitting the audio information. The second wireless headphone is configured to receive, from the audio source, the audio information using the first type of short-range wireless communication; receive, from the first wireless headphone, the error correcting message including the error correcting code; and in response to successfully receiving the audio information directly from the audio source or based on the error correcting code, transmit a first status message (STAT) to the first wireless headphone. The first wireless headphone is further configured to receive, from the second wireless headphone, the first STAT. One of the first and second wireless headphones works in a snoop mode to communicate with the audio source based on communication parameters of another one of the first and second wireless headphones.

In another example, a wireless audio system includes a first wireless headphone and a second wireless headphone. The first wireless headphone is configured to receive, from an audio source, audio information using a first type of short-range wireless communication; in response to not successfully receiving the audio information from the audio source, generate a first status message (STAT); and transmit the first STAT. The second wireless headphone is configured to receive, from the audio source, the audio information using the first type of short-range wireless communication; in response to successfully receiving the audio information from the audio source, generate an error correcting message including an error correcting code generated based on the audio information; and transmit the error correcting message including the error correcting code without transmitting the audio information to the first wireless headphone. The first wireless headphone is further configured to transmit an acknowledge message (ACK) to the audio source in response to successfully receiving the audio source based on the error correcting code received from the second wireless headphone. One of the first and second wireless headphones works in a snoop mode to communicate with the audio source based on communication parameters of another one of the first and second wireless headphones.

In still another example, a wireless audio system includes a first wireless headphone and a second wireless headphone. The first wireless headphone is configured to receive, from an audio source, audio information using a first type of short-range wireless communication; in response to successfully receiving a head of the audio information but unsuccessfully receiving a payload of the audio information from the audio source, generate a first error correcting message without an error correcting code; and transmit the first error correcting message. The second wireless headphone is configured to receive, from the audio source, the audio information using the first type of short-range wireless communication; in response to successfully receiving the audio information from the audio source, transmit an acknowledgement message (ACK) to the audio source and generate a second error correcting message including an error correcting code generated based on the audio information; and transmit the second error correcting message without transmitting the audio information to the first wireless headphone. One of the first and second wireless headphones works in a snoop mode to communicate with the audio source based on communication parameters of another one of the first and second wireless headphones.

This Summary is provided merely for purposes of illustrating some embodiments to provide an understanding of the subject matter described herein. Accordingly, the above-described features are merely examples and should not be construed to narrow the scope or spirit of the subject matter in this disclosure. Other features, aspects, and advantages of this disclosure will become apparent from the following Detailed Description, Figures, and Claims.

BRIEF DESCRIPTION OF THE DRAWINGS

The accompanying drawings, which are incorporated herein and form part of the specification, illustrate the presented disclosure and, together with the description, further serve to explain the principles of the disclosure and enable a person of skill in the relevant art(s) to make and use the disclosure.

Figure 1A:
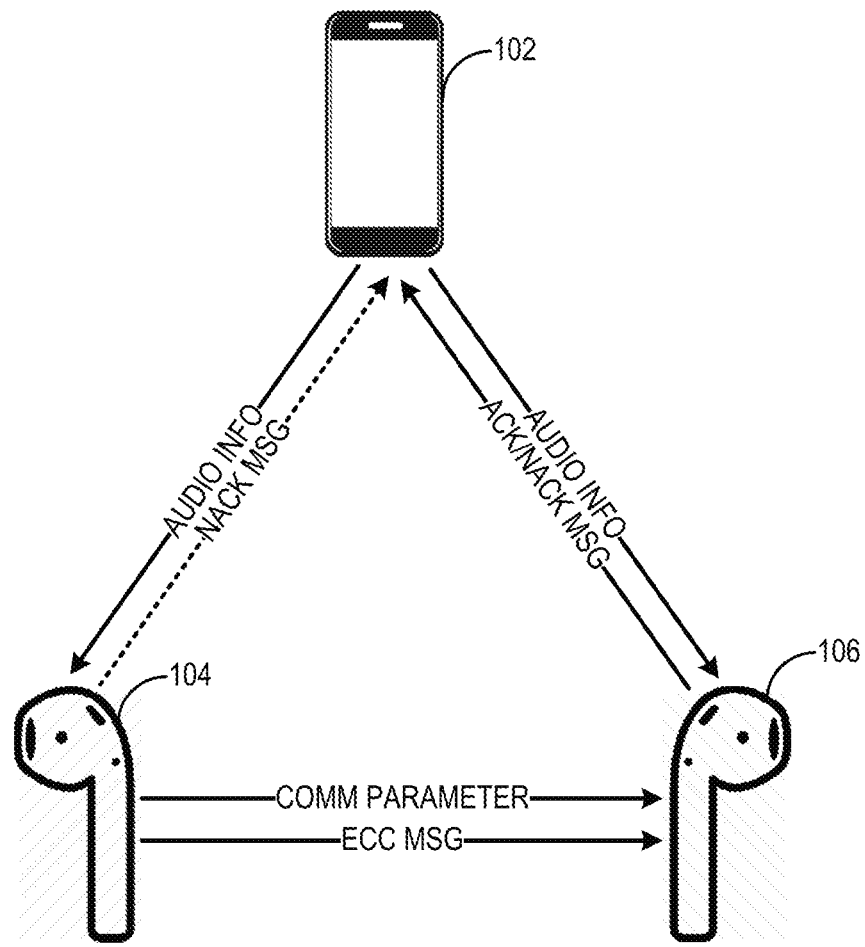
FIGS. 1A-1D are block diagrams illustrating an exemplary wireless audio system in accordance with various embodiments.

The presented disclosure is described with reference to the accompanying drawings. In the drawings, generally, like reference numbers indicate identical or functionally similar elements. Additionally, generally, the left-most digit(s) of a reference number identifies the drawing in which the reference number first appears.

DETAILED DESCRIPTION

Although specific configurations and arrangements are discussed, it should be understood that this is done for illustrative purposes only. It is contemplated that other configurations and arrangements can be used without departing from the spirit and scope of the present disclosure. It is further contemplated that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it is contemplated that such feature, structure or characteristic may also be used in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

True wireless stereo (TWS) headphones (also known as untethered headphones) is a type of wireless headphones that remove the wires between the left and right headphones. In some TWS headphones, a primary wireless headphone can simultaneously communicate with an audio source and a secondary wireless headphone. For example, the audio source transmits data (music, audio, or data packets) to the primary wireless headphone using BLUETOOTH, and the primary wireless headphone then forwards the data to the secondary wireless headphone. This approach can cause the high power consumption of the primary wireless headphone. Also, the physical structures of the human head between the left and right ears can affect the data transmission quality between the primary and secondary wireless headphones, such as causing lagging and/or high latency.

As will be disclosed in detail below, among other novel features, the wireless audio systems disclosed herein can achieve "true wireless stereo" with improved data transmission quality and reduced headphone power consumption. In some embodiments of the present disclosure, the primary wireless headphone establishes a normal communication link with the audio source to receive the audio data (e.g., stereo audio), while the secondary wireless headphone establishes a snoop communication link with the audio source to snoop communications on the normal communication link and receive the audio data from the audio source as well. Having the secondary wireless headphone work in the snoop mode can reduce the power consumption of the primary wireless headphone because the primary wireless headphone no longer needs to forward the audio data to the secondary wireless headphone.

Moreover, one of the primary and secondary wireless headphones, which successfully receives the audio data from the audio source, can transmit an error correcting message including an error correcting code (ECC) based on the successfully-received audio data to the other wireless headphone. The ECC can be used to correct the error in the audio data received by the other wireless headphone without re-transmitting the audio data, thereby reducing the times of re-transmission and improving the system reliability.

Additional novel features will be set forth in part in the description which follows, and in part will become apparent to those skilled in the art upon examination of the following and the accompanying drawings or may be learned by production or operation of the examples. The novel features of the present disclosure may be realized and attained by practice or use of various aspects of the methodologies, instrumentalities, and combinations set forth in the detailed examples discussed below.

FIG. 1A is a block diagram illustrating an exemplary wireless audio system 100 in accordance with an embodiment. Wireless audio system 100 may include an audio source 102, a primary wireless headphone 104, and a secondary wireless headphone 106. Audio source 102 may be any suitable device that can provide audio information including, for example, music or voice in the digital or analog format. Audio source 102 may include, but is not limited to, a handheld device (e.g., dumb or smart phone, tablet, etc.), a wearable device (e.g., eyeglasses, wrist watch, etc.), a radio, a music player, an electronic musical instrument, an automobile control station, a gaming console, a television set, a laptop computer, a desktop computer, a netbook computer, a media center, a set-top box, a global positioning system (GPS), or any other suitable device. Primary wireless headphone 104 and secondary wireless headphone 106 may be a pair of loudspeakers that can be worn on or around the head over a user's ears. Primary wireless headphone 104 and secondary wireless headphone 106 may be any electroacoustic transducers that convert an electrical signal (e.g., representing the audio information provided by audio source 102) to a corresponding sound. In some embodiments, each primary wireless headphone 104 and secondary wireless headphone 106 may be an earbud (also known as earpiece) that can plug into the user's ear canal. In some embodiments, primary wireless headphone 104 and secondary wireless headphone 106 may be TWS headphones, which are individual units that are not physically held by a band over the head and/or electrically connected by a cord. Primary wireless headphone 104 and/or secondary wireless headphone 106 may be combined with a microphone to form a headset according to some embodiments. It is understood that although in FIG. 1A, wireless audio system 100 includes both audio source 102 and the pair of primary and secondary wireless headphones 104 and 106, in some embodiments, wireless audio system 100 may include only primary wireless headphone 104 and secondary wireless headphone 106.

As shown in FIG. 1A, bidirectional communications may be established between audio source 102 and primary wireless headphone 104 and between audio source 102 and secondary wireless headphone 106. In some embodiments, a normal communication link may be established between audio source 102 and primary wireless headphone 104 using a short-range wireless communication (e.g., the BLUETOOTH communication or WiFi communication). That is, primary wireless headphone 104 may work in the normal mode. In the normal mode, primary wireless headphone 104 may receive audio information (e.g., in data packets) transmitted by a carrier wave from audio source 102 via the normal communication link. In some embodiments, audio information may be a stream of audio stereo information in the form of compressed or uncompressed stereo samples for first and second audio channels, such as left-channel audio information and right-channel audio information or the like. The normal communication link may be bidirectional such that primary wireless headphone 104 may transmit messages back to audio source 102 in response to the reception of the audio information from audio source 102. As described below in detail, in some embodiments, primary wireless headphone 104 transmit negative acknowledgement (NACK) messages to audio source 102 in response to not successfully receiving the audio information from audio source 102. In some embodiments, the short-range wireless communication between audio source 102 and primary wireless headphone 104 is a unidirectional communication link in which primary wireless headphone 104 receives the audio information from audio source 102, but does not transmit data (e.g., NACK messages) back to audio source 102.

In some embodiments, a snoop communication link may be established between audio source 102 and secondary wireless headphone 106 using the same short-range wireless communication between audio source 102 and primary wireless headphone 104 (e.g., the BLUETOOTH or WiFi). That is, secondary wireless headphone 106 may work in the snoop mode in which the connection with secondary wireless headphone 106 may not be known by audio source 102. In the snoop mode, secondary wireless headphone 106 may snoop (also known as "listen" or "eavesdrop") the communications between audio source 102 and primary wireless headphone 104 on the normal communication link. By snooping the communications between audio source 102 and primary wireless headphone 104, secondary wireless headphone 106 may also receive the audio information (e.g., in data packets) transmitted by the carrier wave from audio source 102 via the snoop communication link. The snoop communication link may be bidirectional such that secondary wireless headphone 106 may transmit messages back to audio source 102 in response to the reception of the audio information from audio source 102. As described below in detail, the messages transmitted by secondary wireless headphone 106 may include, for example, acknowledgement (ACK) messages and NACK messages.

In some embodiments, audio information may be transmitted by audio source 102 according to the BLUETOOTH protocol at the working radio frequency (RF) band between 2,402 MHz and 2,480 MHz or between 2,400 MHz and 2,483.5 MHz (referred to herein as "2.4 GHz"). BLUETOOTH is a wireless technology standard for exchanging data over short distances, and the BLUETOOTH protocol is one example of short-range wireless communication protocols. In one example, audio source 102 may apply the advanced audio distribution profile (A2DP) of the BLUETOOTH protocol for transmitting the audio information. For example, based on the A2DP, a BLUETOOTH audio streaming of music or voice may be streamed from audio source 102 to primary and secondary wireless headphones 104 and 106 over BLUETOOTH connections. In some embodiments, audio information may be transmitted by audio source 102 according to the WiFi protocol at the working RF band of 2.4 GHz or 5 GHz. WiFi is a wireless technology for wireless local area networking based on the IEEE 802.11 standards, and the WiFi protocol (also known as the 802.11 protocol) is another example of short-range wireless communication protocols. It is understood that the transmission of the audio information by audio source 102 may be using any other suitable short-range wireless communication besides BLUETOOTH and WiFi.

As shown in FIG. 1A, to enable secondary wireless headphone 106 work in the snoop mode, primary wireless headphone 104 may transmit, to secondary wireless headphone 106, communication parameters associated with the normal communication link between audio source 102 and primary wireless headphone 104. The communication parameters may include, but are not limited to, the address of audio source 102 (e.g., the IP address or media access control (MAC) address) and the encryption parameters between audio source 102 and primary wireless headphone 104. The transmission of the communication parameters may be carried on by a short-range wireless communication that is the same type as that for transmitting the audio information by audio source 102 or a different type short-range wireless communication. For example, the short-range wireless communication may be BLUETOOTH communication or WiFi communication. In some embodiments, the transmission of the communication parameters may be at a frequency lower than the frequency used for transmitting the audio information by audio source 102 (e.g., 2.4 GHz). For example, near-field magnetic induction (NFMI) communication may be used for transmitting of the communication parameters. NFMI communication is a short-range wireless communication by coupling a tight, low-power, non-propagating magnetic field between devices. NFMI communication can contain transmission energy within the localized magnetic field, which does not radiate into free space. In some embodiments, the carrier wave frequency for NFMI communication is between about 5 MHz and about 50 MHz (e.g., between 5 MHz and 50 MHz), such as between 5 MHz and 40 MHz, between 5 MHz and 30 MHz, between 5 MHz and 20 MHz, between 5 MHz and 10 MHz, between 15 MHz and 50 MHz, between 25 MHz and 50 MHz, between 35 MHz and 50 MHz, and between 45 MHz and 50 MHz. In some embodiments, the carrier wave frequency is about 10 MHz (e.g., 10 MHz) or about 13.56 MHz (e.g., 13.56 MHz).

Upon receiving the communication parameters from primary wireless headphone 104, secondary wireless headphone 106 can establish the snoop communication link with audio source 102 based on the communication parameters. For example, secondary wireless headphone 106 may pretend to be primary wireless headphone 104 so that audio source 102 does not recognize secondary wireless headphone 106 as a newly-connected device and thus, will not disconnect and reconnect with secondary wireless headphone 106.

In response to successfully receiving the audio information (e.g., a BLUETOOTH audio data packet) from audio source 102, primary wireless headphone 104 may be configured to generate an error correcting code (ECC) based on the audio information (e.g., by coding the payload of the BLUETOOTH audio data packet). Primary wireless headphone 104 then may transmit an error correcting message (ECC MSG) including the ECC to secondary wireless headphone 106. The ECC may include, but not limited to, Reed-Solomon (RS) code, Bose-Chaudhuri-Hocquenghem (BCH) code, etc. In case secondary wireless headphone 106 does not successfully receive the audio information from audio source 102 (e.g., error found in the payload of a BLUETOOTH audio data packet), the ECC contained in the error correcting message from primary wireless headphone 104 may be used by secondary wireless headphone 106 to correct the audio information (e.g., the error found in the payload of the BLUETOOTH audio data packet). Also, the transmission of an error correcting message with an ECC can also serve as an ACK message indicative of the successful reception of the audio information by primary wireless headphone 104. Thus, when secondary wireless headphone 106 successfully receives the audio information from audio source 102 based on the ECC from primary wireless headphone 104, secondary wireless headphone 106 may transmit an ACK message to audio source 102 indicative of the successful receptions of the audio information by both primary and secondary wireless headphones 104 and 106. It is understood that secondary wireless headphone 106 may successfully receive the audio information from audio source 102 based on the ECC, either when secondary wireless headphone 106 successfully receives the audio information from audio source 102 without error at the first place (i.e., without the need of correction using the ECC) or when secondary wireless headphone 106 successfully corrects the audio information from audio source 102 based on the ECC. In either case, secondary wireless headphone 106 is considered as "successfully receiving the audio information from audio source 102 based on the ECC."

The transmission of the error correcting message may be carried on by a short-range wireless communication that is the same type as that for transmitting the audio information by audio source 102 or a different type short-range wireless communication. For example, the short-range wireless communication for transmitting the error correcting message may be BLUETOOTH communication or WiFi communication. The WiFi communication may be based on any suitable standards, such as IEEE 802.11b, 802.11d, 802.11g, etc. In some embodiments, the transmission of the communication parameters may be at a frequency lower than the frequency used for transmitting the audio information by audio source 102 (e.g., 2.4 GHz). For example, NFMI communication may be used for transmitting of the error correcting message. In some embodiments, the carrier wave frequency for NFMI communication is between about 5 MHz and about 50 MHz (e.g., between 5 MHz and 50 MHz), such as between 5 MHz and 40 MHz, between 5 MHz and 30 MHz, between 5 MHz and 20 MHz, between 5 MHz and 10 MHz, between 15 MHz and 50 MHz, between 25 MHz and 50 MHz, between 35 MHz and 50 MHz, and between 45 MHz and 50 MHz. In some embodiments, the carrier wave frequency is about 10 MHz (e.g., 10 MHz) or about 13.56 MHz (e.g., 13.56 MHz). In some embodiments in which WiFi communication or NFMI communication is used between primary wireless headphone 104 and secondary wireless headphone 106, instead of transmitting the error correcting messages, primary wireless headphone 104 transmits the entire audio information (e.g., the entire BLUETOOTH audio data packets) to secondary wireless headphone 106.

In some embodiments, the reception of the audio information from audio source 102 is not successful at primary wireless headphone 104, primary wireless headphone 104 may transmit a NACK message to audio source 102. In some embodiments, in response to not successfully receiving the audio information from audio source 102, primary wireless headphone 104 may not transmit the NACK message to audio source 102, but instead, transmitting a pseudo error correcting message without the ECC to secondary wireless headphone 106 or not transmitting any message to secondary wireless headphone 106. As to secondary wireless headphone 106, in response to at least one of (i) not successfully receiving the audio information from audio source 102 based on the ECC (indicative of the unsuccessful reception of the audio source by secondary wireless headphone 106 even with the ECC), or (ii) not successfully receiving the error correcting message including the ECC from primary wireless headphone 104 (indicative of the unsuccessful reception of the audio source by primary wireless headphone 104), secondary wireless headphone 106 may transmit a NACK message to audio source 102. It is understood that secondary wireless headphone 106 may not successfully receive the audio information from audio source 102 even after the correction based on the ECC, i.e., the ECC correction at secondary wireless headphone 106 fails.

Figure 1B:
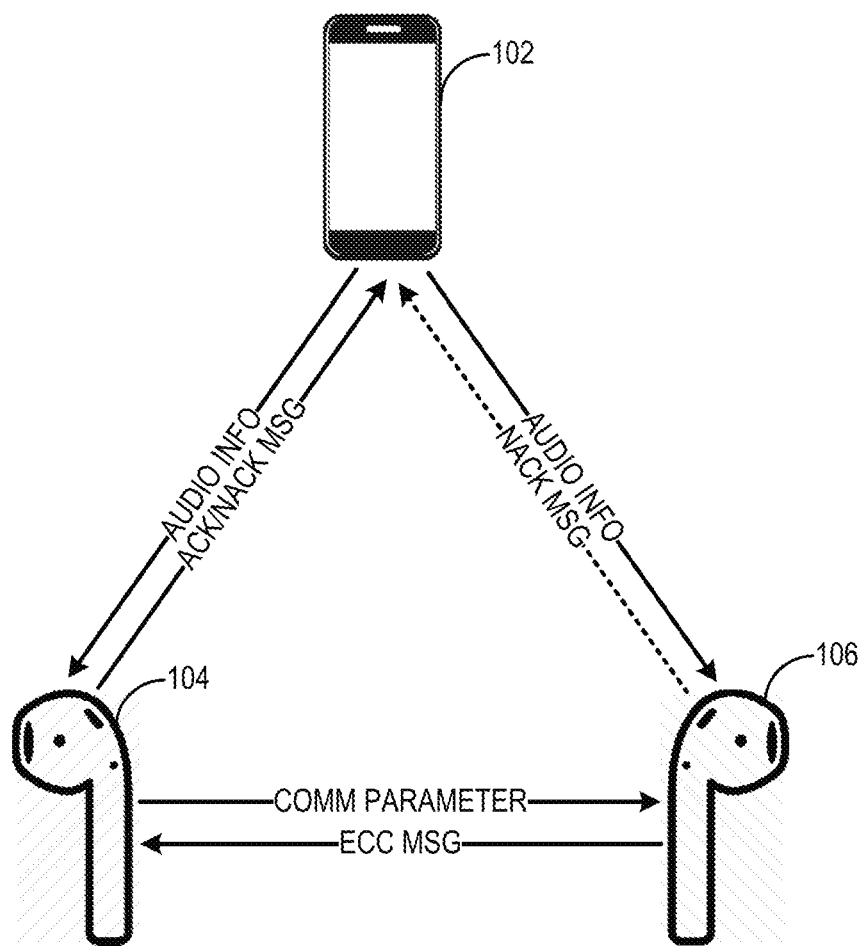

FIG. 1B is a block diagram illustrating exemplary wireless audio system 100 in accordance with another embodiment. The same functions of audio source 102, primary wireless headphone 104, and secondary wireless headphone 106 that have been described above with respect to FIG. 1A will not be repeated with respect to FIG. 1B. Different from the example of FIG. 1A, in this example, instead of generating the ECC and transmitting the error correcting message including the ECC by primary wireless headphone 104, secondary wireless headphone 106 may generate an ECC based on the audio information in response to successfully receiving the audio information from audio source 102 and then transmit an error correcting message including the ECC to primary wireless headphone 104. Primary wireless headphone 104 then may receive the error correcting message including the ECC from secondary wireless headphone 106 and in response to successfully receiving the audio information from audio source 102 based on the ECC, transmit an ACK message to audio source 102.

That is, in implementing the features related to ECC disclosed herein, the roles of primary and secondary wireless headphones can be switched. In other words, either primary or secondary wireless headphone 104 or 106 can be the party generating and transmitting the ECC (ECC transmitting headphone), and either primary or secondary wireless headphone 104 or 106 can be the party utilizing the ECC for correcting the audio information and transmitting the ACK message to audio source 102 (ECC receiving headphone). In some embodiments, the ECC transmitting headphone and the ECC receiving headphone can be dynamically switched based on the signal quality of each of the ECC transmitting headphone and ECC receiving headphone. In some embodiments, the headphone with better signal quality is used as ECC transmitting headphone. That is, the signal quality of the ECC transmitting headphone may be better than the signal quality of the ECC receiving headphone. As a result, the likelihood that the ECC transmitting headphone can successfully receive the audio information from audio source 102 may be increased, thereby transmitting more error correcting messages including the ECC. With more error correcting messages including the ECC, the ECC receiving headphone may correct more audio information with errors, thereby reducing the numbers of re-transmission and improving the system reliability. In some embodiments, the headphone with better signal quality is used as ECC receiving headphone. That is, the signal quality of the ECC receiving headphone may be better than the signal quality of the ECC transmitting headphone. As a result, the likelihood that audio source 102 can successfully receive the ACK and/or NACK messages from the ECC receiving headphone may be increased.

Figure 1C:
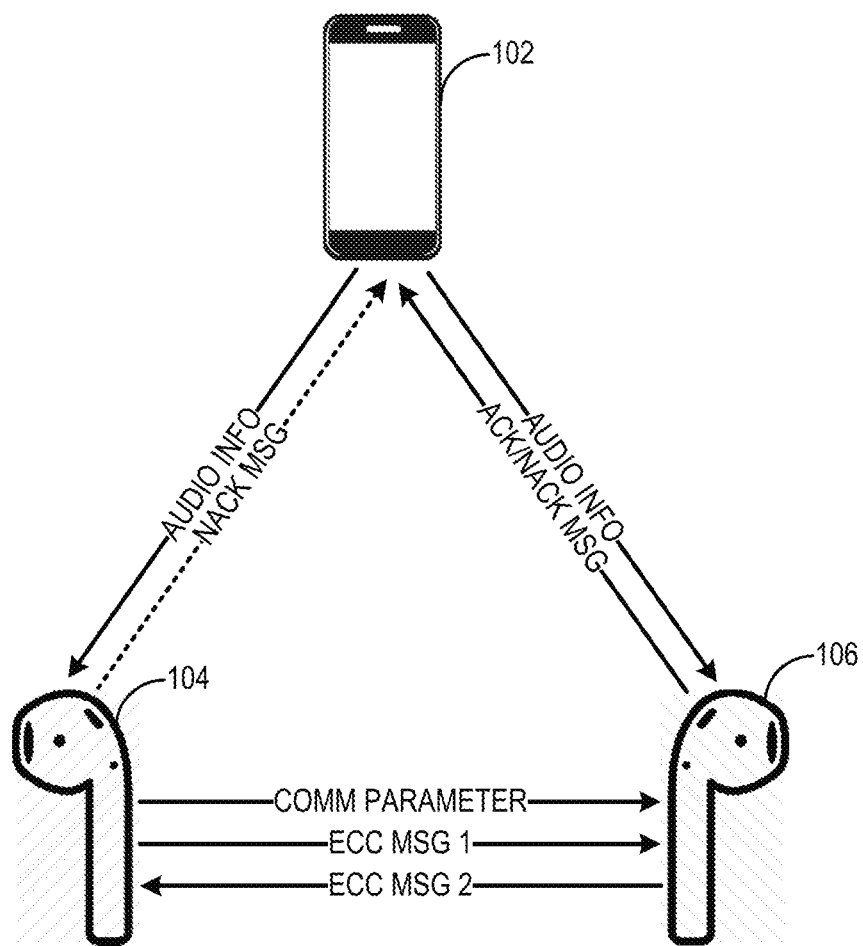

FIG. 1C is a block diagram illustrating exemplary wireless audio system 100 in accordance with another embodiment. The same functions of audio source 102, primary wireless headphone 104, and secondary wireless headphone 106 that have been described above with respect to FIG. 1A will not be repeated with respect to FIG. 1C. Different from the example of FIG. 1A, in this example, when primary wireless headphone 104 successfully receives part of the audio information (e.g., the header of a BLUETOOTH audio data packet) but fails to receive other parts of the audio information (e.g., the payload of the BLUETOOTH audio data packet), primary wireless headphone 104 may transmit a first error correcting message (ECC MSG 1) without an ECC to secondary wireless headphone 106. In this situation, when secondary wireless headphone 106 successfully receives the audio information from audio source 102 as well as the first error correcting message without the ECC from primary wireless headphone 104, secondary wireless headphone 106 may generate an ECC based on the audio information and transmit a second error correcting message (ECC MSG 2) including the ECC to primary wireless headphone 104. Primary wireless headphone 104 then may correct the part of the audio information that fails to be received without the need of re-transmission.

Figure 1D:
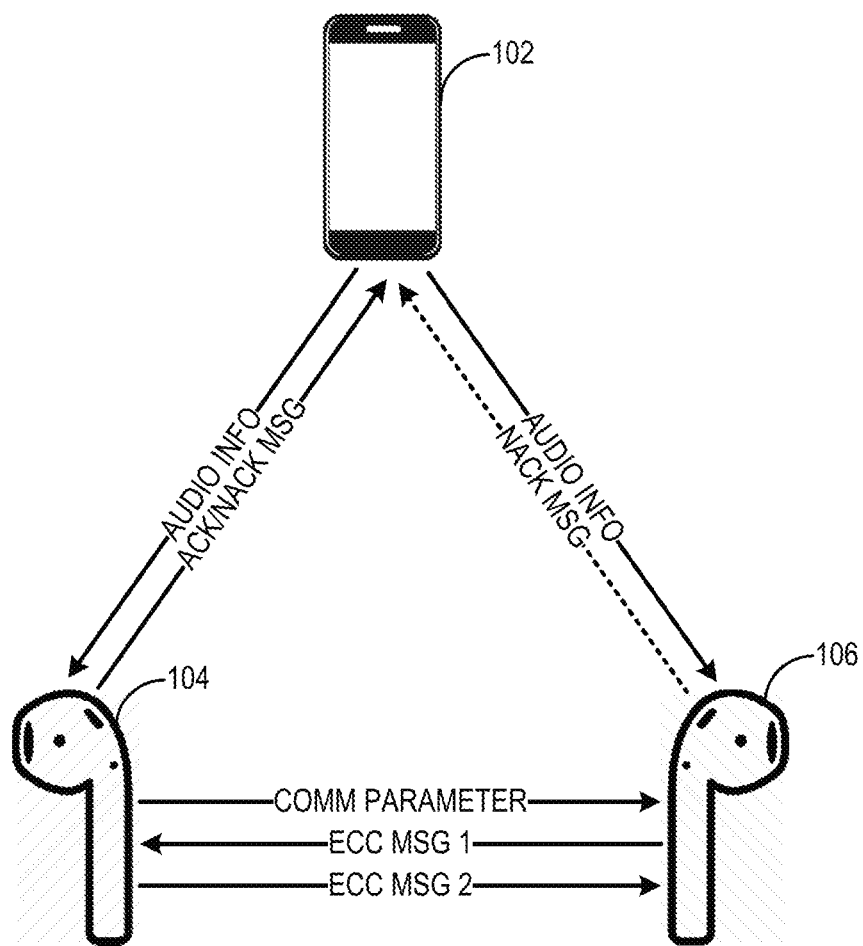

FIG. 1D is a block diagram illustrating exemplary wireless audio system 100 in accordance with another embodiment. The same functions of audio source 102, primary wireless headphone 104, and secondary wireless headphone 106 that have been described above with respect to FIG. 1C will not be repeated with respect to FIG. 1D. Similar to the relationship between FIGS. 1A and 1B, as shown in FIGS. 1C and 1D, the ECC transmitting headphone that transmits the first error correcting message and the ECC receiving headphone that receives the first error correcting message can be switched between primary and secondary wireless headphones 104 and 106.

Figure 2:
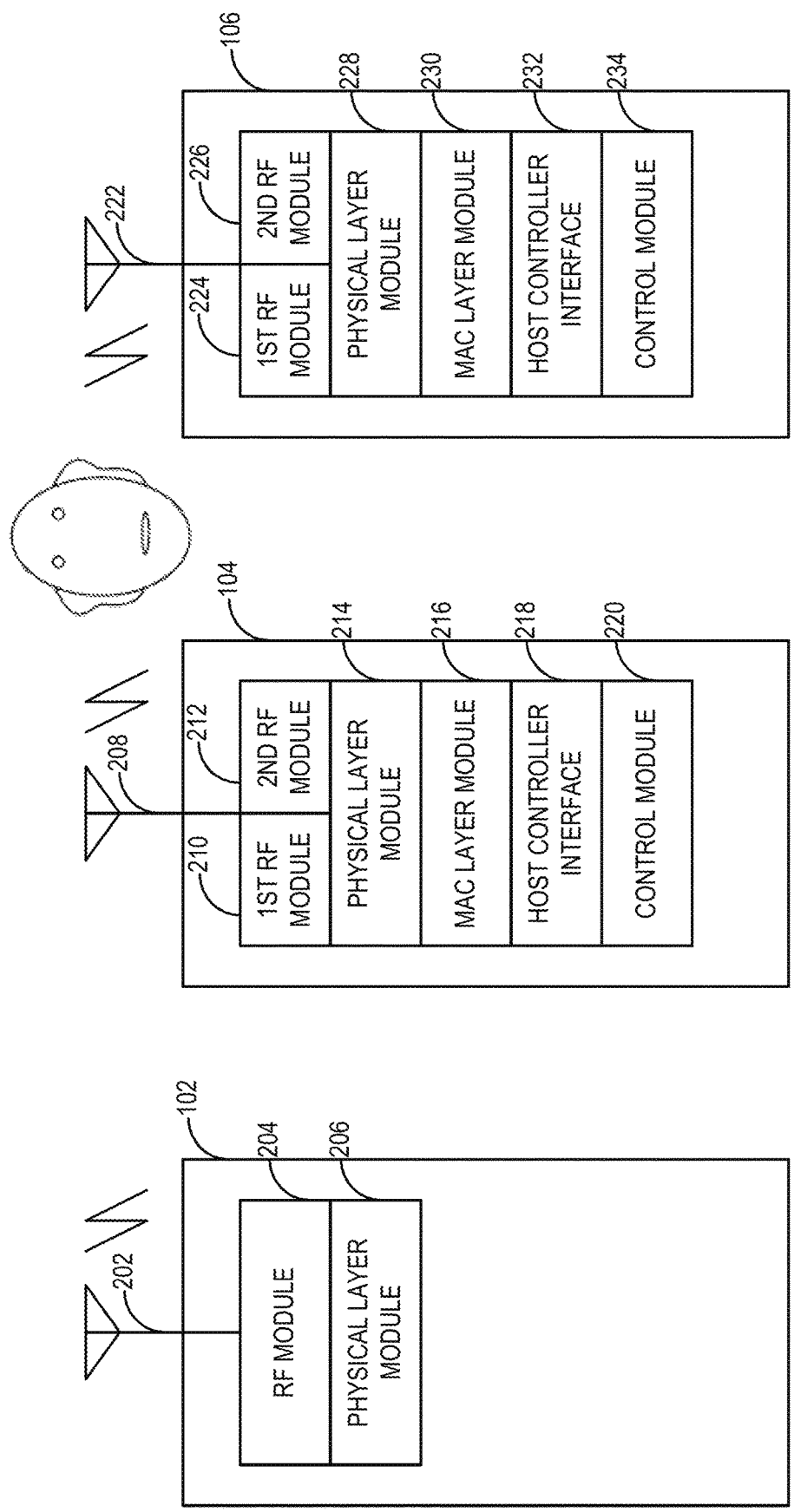
FIG. 2 is a detailed block diagram of the exemplary wireless audio system in FIGS. 1A-1D in accordance with an embodiment.

FIG. 2 is a detailed block diagram of exemplary wireless audio system 100 in FIGS. 1A-1D in accordance with an embodiment. Audio source 102 in this example includes an antenna 202, a radio-frequency (RF) module 204 and a physical layer module 206. It is understood that additional module(s) may be included in audio source 102, either in the same integrated circuit (IC) chip in which RF module 204 and physical layer module 206 are formed or in a separate IC chip.

Antenna 202 may include an array of conductors for transmitting and receiving radio waves at one or more RF bands corresponding to RF module 204. For example, antenna 202 may transmit audio information modulated by a carrier wave using RF module 204. As described above, the audio information may be any music and/or voice information provided by audio source 102. For example, the audio information may be a stream of audio stereo information in the form of compressed or uncompressed stereo samples for first and second audio channels, such as left-channel audio information and right-channel audio information or the like. In some embodiments, the audio information may be mono audio information in a single audio channel or audio information in more than two separate audio channels (e.g., left, central, and right channels). Antenna 202 may also receive the messages modulated by a carrier wave. For example, the messages may be any messages used for acknowledging the reception of the audio information by primary wireless headphone 104 or secondary wireless headphone 106, such as ACK and NACK messages.

RF module 204 and physical layer module 206 may be in the same IC chip that implements a short-range wireless communication protocol, such as the BLUETOOTH protocol or WiFi protocol. RF module 204 may be configured to modulate the audio information using the carrier wave at a frequency, for example, at 2.4 GHz for BLUETOOTH or WiFi communication, and transmit the audio information at the frequency via antenna 202. RF module 204 may be further configured to receive and demodulate the messages and/or the audio information (e.g., the voice information during voice calls) from the carrier wave at the same frequency, for example, at 2.4 GHz. Physical layer module 206 may be configured to generate the physical link (baseband) between audio source 102 and primary wireless headphone 104 (and secondary wireless headphone 106 even though audio source 102 may not be aware of the connection with secondary wireless headphone 106) according to the short-range wireless communication protocol. For example, physical layer module 206 may generate baseband packets (e.g., BLUETOOTH packets) based on the music and/or voice data (payload) and perform error correction using any known methods, such as forward error correction (FEC) and automatic repeat request (ARQ).

In some embodiments, the transmission of the audio information may occur at the audio data packet level in time slots. For example, according to the standard BLUETOOTH protocol, the physical channel of the BLUETOOTH connection is divided into time slots, each of which has the same duration (e.g., 625 µs). RF module 204 in conjunction with antenna 202 may transmit an audio data packet (N) in a time slot (N). Based on the receptions of the audio data packet (N) in the time slot (N) at primary wireless headphone 104 and secondary wireless headphone 106, in the subsequent time slot (N+1), RF module 204 in conjunction with antenna 202 may receive a message from primary wireless headphone 104 or secondary wireless headphone 106 alone, or messages from both primary wireless headphone 104 and secondary wireless headphone 106, which are generated in response to the reception status of the audio data packet (N) in the time slot (N). It is understood that additional components, although not shown in FIG. 2, may be included in audio source 102.

Primary wireless headphone 104 in this example may include a wireless transceiver (primary wireless transceiver) configured to receive the audio information transmitted by audio source 102 and transmit or receive error correcting messages (with or without an ECC) in response to the reception of the audio information to audio source 102. The wireless transceiver may be further configured to transmit the communication parameters to secondary wireless headphone 106. Primary wireless headphone 104 may include other components, such as an enclosure, speakers, and a microphone (not shown). Primary wireless transceiver may include an antenna 208, a first RF module 210, a second RF module 212, a physical layer module 214, a MAC layer module 216, a host controller interface (HCI) 218, and a control module 220. Some or all of the modules mentioned above may be integrated in the same IC chip to reduce the chip size and/or power consumption. Primary wireless headphone 104 may present at least part of the audio information received from audio source 102 to the user via one of the user's ear. For example, the speaker of primary wireless headphone 104 may play music and/or voice based on the entire audio information or one audio channel of the audio information.

Antenna 208 may include an array of conductors for transmitting and receiving radio waves at two or more RF bands corresponding to first RF module 210 and second RF module 212. First RF module 210 may be configured to receive, from audio source 102, audio information and transmit, to audio source 102, messages (e.g., ACK and NACK messages) via antenna 208. Second RF module 212 may be configured to transmit, to secondary wireless headphone 106, the communication parameters and error correcting messages (when primary wireless headphone 104 works as the ECC transmitting headphone) via antenna 208. In some embodiments, second RF module 212 may be further configured to receive, from secondary wireless headphone 106, error correcting messages (when primary wireless headphone 104 works as the ECC receiving headphone) via antenna 208.

In some embodiments, the first frequency used for the communications between audio source 102 and primary wireless headphone 104 is a "high" RF, such as 2.4 GHz used in BLUETOOTH or WiFi communication; the second frequency used for the communications between primary wireless headphone 104 and secondary wireless headphone 106 is a "low" RF, such as between 5 MHz and 50 MHz for NFMI communication. Both first RF module 210 and second RF module 212 may implement substantially the same short-range wireless communication protocol for short-range wireless communications at different RF bands. For example, first RF module 210 may implement a first short-range wireless communication protocol (e.g., the BLUETOOTH protocol or WiFi protocol), and second RF module 212 may implement a second short-range wireless communication protocol amended from the first short-range wireless communication protocol (e.g., the amended BLUETOOTH or amended WiFi protocol). The second short-range wireless communication protocol may be substantially the same as the first short-range wireless communication protocol except the carrier wave frequency (and any specification related to the carrier wave frequency).

In some embodiments, first RF module 210 may operate at about 2.4 GHz (e.g., 2.4 GHz). In some embodiments, second RF module 212 may operate between about 5 MHz (e.g., 5 MHz) and about 50 MHz (e.g., 50 MHz) for NFMI communication. For example, second RF module 212 may operate at about 10 MHz (e.g., 10 MHz). In some embodiments, second RF module 212 may implement the frequency-hopping spread spectrum (FHSS) technique, such that the second frequency (low RF) may include a plurality of frequencies based on FHSS. For example, second RF module 212 may implement the amended BLUETOOTH protocol and use the FHSS specification in the amended BLUETOOTH protocol. FHSS can further reduce signal interference.

Physical layer module 214 may be configured to generate the physical links (baseband) between audio source 102 and primary wireless headphone 104 according to the short-range wireless communication protocol and the amended short-range wireless communication protocol used by first RF module 210 and second RF module 212, respectively. For example, physical layer module 214 may generate baseband packets (e.g., BLUETOOTH packets) based on the music and/or voice data (payload) and perform error correction using any known methods, such as FEC and ARQ. MAC layer module 216 may be configured to generate the logical data channel links between audio source 102 and primary wireless headphone 104 according to the short-range wireless communication protocol and between primary wireless headphone 104 and secondary wireless headphone 106 according to the amended short-range wireless communication protocol used by first RF module 210 and second RF module 212, respectively. For example, MAC layer module 216 may generate link control channel, link manager channel, user asynchronous channel, user isochronous channel, and user synchronous channel based on the BLUETOOTH protocol (and the amended BLUETOOTH protocol). HCI 218 may be configured to provide a common interface to physical layer module 214 and MAC layer module 216 and access to hardware status and control registers. For example, when implementing the BLUETOOTH protocol (and the amended BLUETOOTH protocol), HCI 218 may provide a uniform method of accessing the BLUETOOTH baseband capabilities.

In some embodiments, the error correction messages are transmitted based on a standard BLUETOOTH protocol in network layers above a physical layer, for example, by MAC layer module 216 and HCI 218, and are transmitted based on an amended BLUETOOTH protocol in the physical layer, for example, by physical layer module 214. For example, the error correcting messages can be transmitted at a higher symbol rate than the standard BLUETOOTH protocol in the physical layer, for example, by physical layer module 214 according to the amended BLUETOOTH protocol. In some embodiments, the symbol rate for transmitting the error correcting messages in the physical layer is 2M/s, which is higher than the standard BLUETOOTH symbol rate of 1M/s. By increasing the symbol rate in the physical layer for the error correcting messages, more ECCs can be transmitted, thereby improving the error correction capability.

As described above, primary wireless headphone 104 can either an ECC transmitting headphone or an ECC receiving headphone. In some embodiments, control module 220 may control primary wireless headphone 104 to switch between the ECC transmitting headphone and the ECC receiving headphone. In some embodiments, control module 220 may determine whether to switch the ECC headphone mode of primary wireless headphone 104 based on one or more parameters associated with primary wireless headphone 104 and/or secondary wireless headphone 106, such as signal quality. In one example, control module 220 may determine whether the signal quality (e.g., signal-to-noise ratio (SNR) or received signal strength indicator (RSSI)) is above a threshold and cause primary wireless headphone 104 to switch to a different ECC headphone mode. That is, in some embodiments, the wireless headphone with the relatively poor signal quality may be used as the ECC transmitting headphone, while the wireless headphone with the relatively good signal quality may be used as the ECC receiving headphone, so that the ACK/NACK messages transmitted by the ECC receiving headphone can be more easily received by audio source 102. In some embodiments, the wireless headphone with the relatively poor signal quality may be used as the ECC receiving headphone, while the wireless headphone with the relatively good signal quality may be used as the ECC transmitting headphone, so that more error correcting messages with ECCs can be generated to reduce the times of re-transmission.

Control module 220 may be further configured to control the generation of the ECC based on the successfully received audio information when primary wireless headphone 104 is working as an ECC transmitting headphone or control the correction of the audio information based on the received ECC when primary wireless headphone 104 is working as an ECC receiving headphone. When working as the ECC receiving headphone, control module 220 may be further configured to determine whether to transmit an ACK message or a NACK message to audio source 102 depending on various factors, including (1) whether an error correcting message is received from secondary wireless headphone 106 (the ECC transmitting headphone), (2) whether the received error correcting message includes an ECC, (3) whether the audio information received by primary wireless headphone 104 needs correction, and (4) whether the correction of the audio information based on the ECC is successful.

Secondary wireless headphone 106 in this example may include a wireless transceiver (secondary wireless transceiver) configured to receive (snoop) the audio information transmitted by audio source 102 and transmit or receive error correcting messages (with or without an ECC) in response to the reception of the audio information to audio source 102. The wireless transceiver may be further configured to receive the communication parameters from primary wireless headphone 104. Secondary wireless headphone 106 may include other components, such as an enclosure, speakers, and a microphone (not shown). Secondary wireless transceiver may include an antenna 222, a first RF module 224, a second RF module 226, a physical layer module 228, a MAC layer module 230, an HCI 232, and a control module 234. Some or all of the modules mentioned above may be integrated in the same IC chip to reduce the chip size and/or power consumption. Secondary wireless headphone 106 may present at least part of the audio information to the user via one of the user's ear. For example, the speaker of secondary wireless headphone 106 may play music and/or voice based on the audio information or one audio channel of the audio information.

In this example, secondary wireless headphone 106 has the same hardware structures as primary wireless headphone 104. The functions of each module mentioned above in secondary wireless headphone 106 are the same as the counterparts in primary wireless headphone 104 and thus, will not be repeated. Different from primary wireless headphone 104, secondary wireless headphone 106 in this example works in the snoop mode, so that audio source 102 may not recognize the connection with secondary wireless headphone 106. To enable secondary wireless headphone 106 to work in the snoop mode, in some embodiments, second RF module 212 of primary wireless headphone 104 may transmit, to second RF module 226 of secondary wireless headphone 106, one or more communication parameters associated with the short-range wireless communication protocol used between audio source 102 and primary wireless headphone 104. The communication parameters may include any parameters necessary for enabling secondary wireless headphone 106 to snoop the communications between audio source 102 and primary wireless headphone 104, such as the address of audio source 102 (e.g., the IP address or MAC address) and the encryption parameters used between audio source 102 and primary wireless headphone 104.

As described above, similar to control module 220 of primary wireless headphone 104, control module 234 of secondary wireless headphone 106 may control secondary wireless headphone 106 to switch between the ECC transmitting headphone and the ECC receiving headphone. The switch may be determined based on one or more parameters, such as the relative signal quality between primary wireless headphone 104 and secondary wireless headphone 106. For example, both control modules 220 and 234 may work together to switch the ECC headphone modes of primary wireless headphone 104 and secondary wireless headphone 106 to improve the overall performance of the pair of wireless headphones 104 and 106 as described above in detail.

Control module 234 may be further configured to control the generation of the ECC based on the successfully received audio information when secondary wireless headphone 106 is working as an ECC transmitting headphone or control the correction of the audio information based on the received ECC when secondary wireless headphone 106 is working as an ECC receiving headphone. When working as the ECC receiving headphone, control module 234 may be further configured to determine whether to transmit an ACK message or a NACK message to audio source 102 depending on various factors, including (1) whether an error correcting message is received from primary wireless headphone 104 (the ECC transmitting headphone), (2) whether the received error correcting message includes an ECC, (3) whether the audio information received by secondary wireless headphone 106 needs correction, and (4) whether the correction of the audio information based on the ECC is successful.

Although in FIG. 2, the same physical layer module, MAC layer module, and HCI are used for both first and second RF modules 210 and 212 or 224 and 226, it is understood that in some embodiments, each of first and second RF modules 210 and 212 or 224 and 226 may have its own physical layer module, MAC layer module, and/or HCI. In other words, each of primary and secondary wireless headphones 104 and 106 may include two physical layer modules, two MAC layer modules, and/or two HCIs. As a result, two different types of short-range wireless communications can be implemented by each of primary and secondary wireless headphones 104 and 106. In some embodiments, second RF modules 212 and 226 and their respective physical layer modules, MAC layers modules, and/or HCIs are used to implement WiFi communication or NFMI communication between primary and secondary wireless headphones 104 and 106 for transmitting and receiving error correcting messages.

Figure 3:
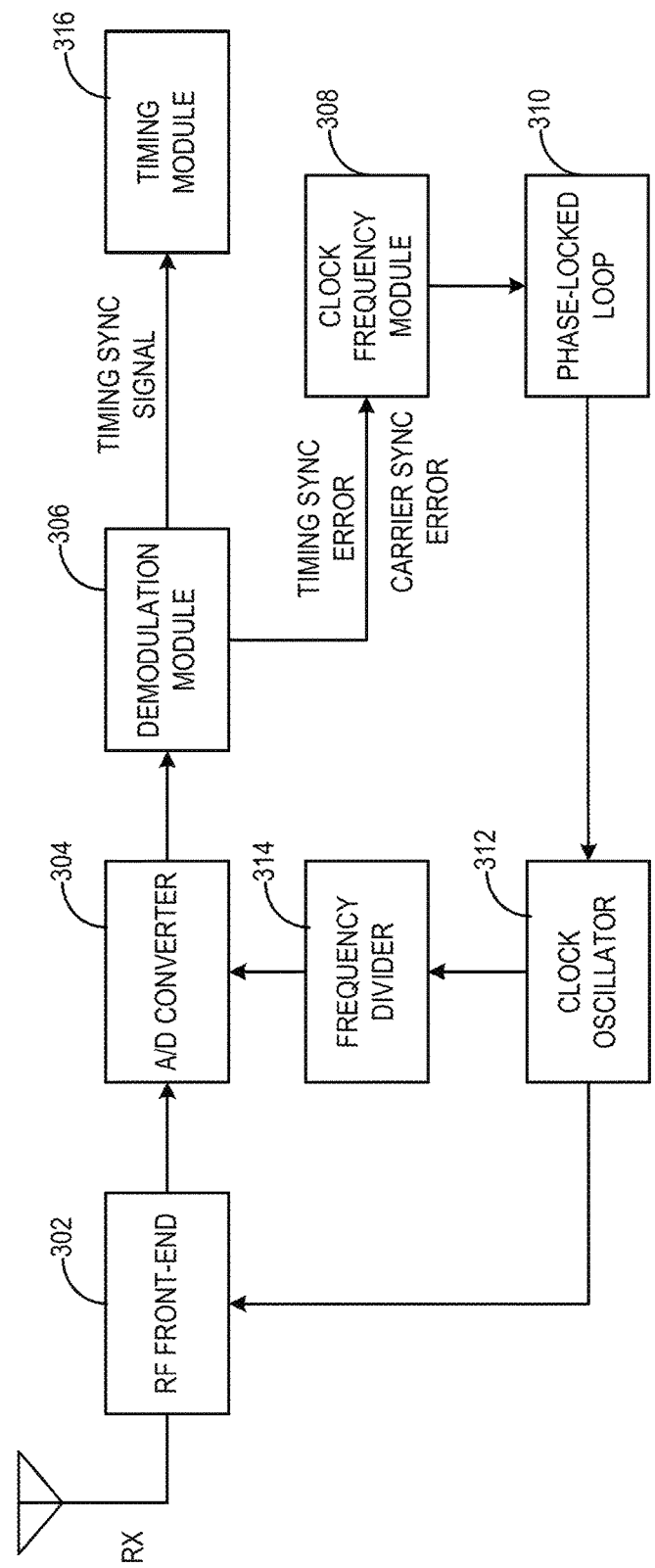
FIG. 3 is a block diagram illustrating an exemplary wireless headphone in accordance with an embodiment.

FIG. 3 is a block diagram illustrating exemplary wireless headphone 104 or 106 in accordance with an embodiment. In this example, each of primary wireless headphone 104 and secondary wireless headphone 106 includes an RF front-end 302, an analog-to-digital (A/D) converter 304, a demodulation module 306, a clock frequency module 308, a phase-locked loop (PLL) 310, a clock oscillator 312, a frequency divider 314, and a timing module 316. RF front-end 302 may be operatively coupled to an antenna and configured to receive the RF signals, such as audio signals representing the audio information described above in detail. RF front-end 302 may include an antenna switch, low-noise amplifier (LNA), power amplifier (PA), filter, etc. A/D converter 304 may be operatively coupled to RF front-end 302 and configured to convert an audio signal from an analog signal to a digital signal and provide the digital audio signal to demodulation module 306 that is operatively coupled to A/D converter 304. The A/D conversion may be performed by A/D converter 304 based on an A/D sampling rate determined by frequency divider 314.

In some embodiments, primary wireless headphone 104 and secondary wireless headphone 106 may not communicate directly except for transmitting the communication parameters and error correction messages as describe above. Primary wireless headphone 104 and secondary wireless headphone 106 may be synchronized via their communications with audio source 102. The local clocks of each of primary wireless headphone 104 and secondary wireless headphone 106 may be synchronized with the remote clock of audio source 102 and thus, are synchronized with one another. By indirectly synchronizing primary wireless headphone 104 and secondary wireless headphone 106 via audio source 102, the sound can be simultaneously played by both primary wireless headphone 104 and secondary wireless headphone 106. One example of indirectly synchronizing primary wireless headphone 104 and secondary wireless headphone 106 via audio source 102 is disclosed in corresponding U.S. patent application Ser. No. 15/939,258, having a title "SYNCHRONIZATION OF WIRELESS HEADPHONES," which is incorporated herein by reference.

Figure 4A:
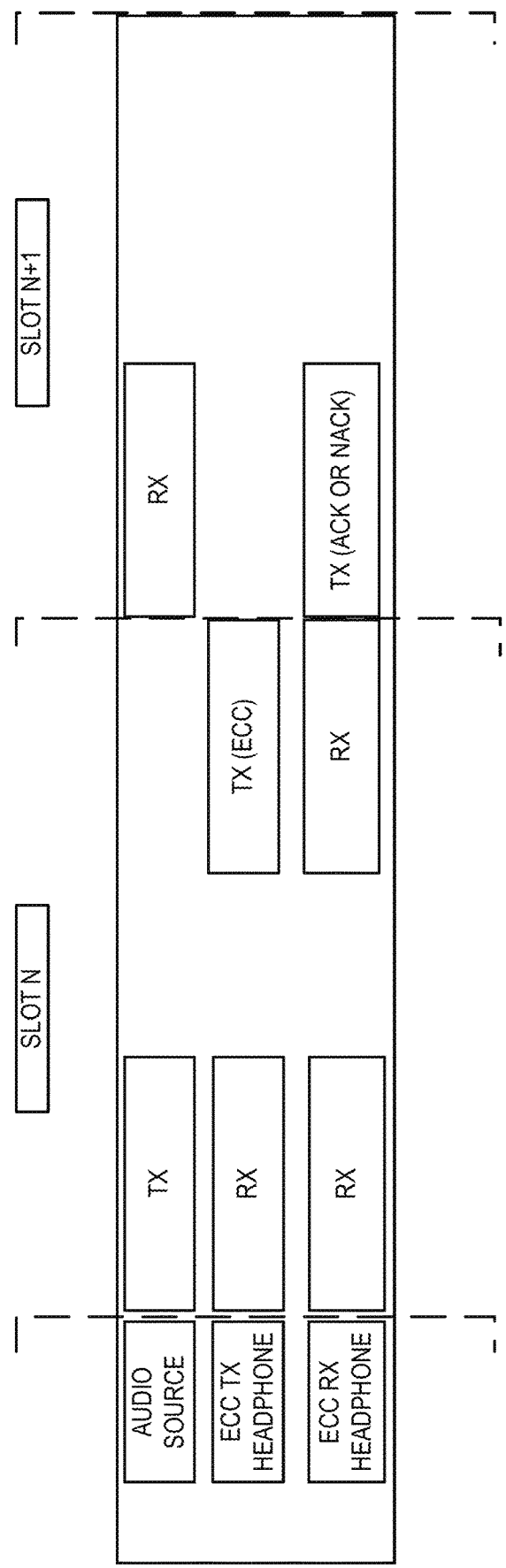
FIGS. 4A-4E are timing diagrams of exemplary wireless audio systems in accordance with various embodiments.

FIGS. 4A-4E are timing diagrams of exemplary wireless audio systems in accordance with various embodiments. As described above, error correcting messages may be transmitted from an ECC transmitting headphone to an ECC receiving headphone. As described above, in some embodiments, each of the time slots (e.g., N and N+1) has the same duration, for example, 625 μs for BLUETOOTH communication. As shown in FIG. 4A, in a first time slot (N), the audio source transmits an audio data packet (e.g., a BLUETOOTH audio data packet), and each of the ECC transmitting and receiving headphones receives the audio data packet. In the same time slot (N), the ECC transmitting headphone transmits an error correcting message including an ECC or a pseudo error correcting message without an ECC depending on whether the ECC transmitting headphone successfully receives the audio data packet in time slot (N). In the same time slot (N), the ECC receiving headphone receives the error correcting message or pseudo error correcting message from the ECC transmitting headphone.

In a second time slot (N+1) immediately subsequent to the first time slot (N), the ECC receiving headphone may transmit an ACK message or a NACK message to the audio source depending on whether it successfully receives the audio data packet based on the error correcting message in the first time slot (N). In a first situation, if in the first time slot (N), the ECC receiving headphone receives the error correcting message including the ECC from the ECC transmitting headphone and corrects the error in the audio data packet based on the ECC (i.e., successfully receiving the audio data packet after the correction), then in the second time slot (N+1), the ECC receiving headphone transmits an ACK message to the audio source. In a second situation, if in the first time slot (N), the ECC receiving headphone receives the error correcting message including the ECC from the ECC transmitting headphone and does not find any error in the audio data packet (i.e., successfully receiving the audio data packet without the correction), then in the second time slot (N+1), the ECC receiving headphone transmits an ACK message to the audio source as well. In a third situation, if in the first time slot (N), the ECC receiving headphone receives the error correcting message including the ECC from the ECC transmitting headphone and fails to correct the error in the audio data packet using the ECC (i.e., not successfully receiving the audio data packet), then in the second time slot (N+1), the ECC receiving headphone transmits a NACK message to the audio source. In a fourth situation, if in the first time slot (N), the ECC receiving headphone receives the pseudo error correcting message without the ECC from the ECC transmitting headphone or does not receive any error correcting message (i.e., not successfully receiving the error correcting message including the ECC), then in the second time slot (N+1), the ECC receiving headphone transmits a NACK message to the audio source as well.

In some embodiments, if in the first time slot (N), the ECC transmitting headphone does not successfully receive the audio data packet from the audio source, then in the second time slot (N+1), the ECC transmitting headphone transmits an ACK message to the audio source as well. FIG. 5 is a depiction of an exemplary header of an ACK or NACK message in accordance with an embodiment. The header includes an acknowledge indication bit (ARQN) indicative of whether the packet is an ACK message or a NACK message. The packet is an ACK message if ARQN is 1, as shown in FIG. 5. The packet is a NACK message if ARQN is 0.

Figure 4B:
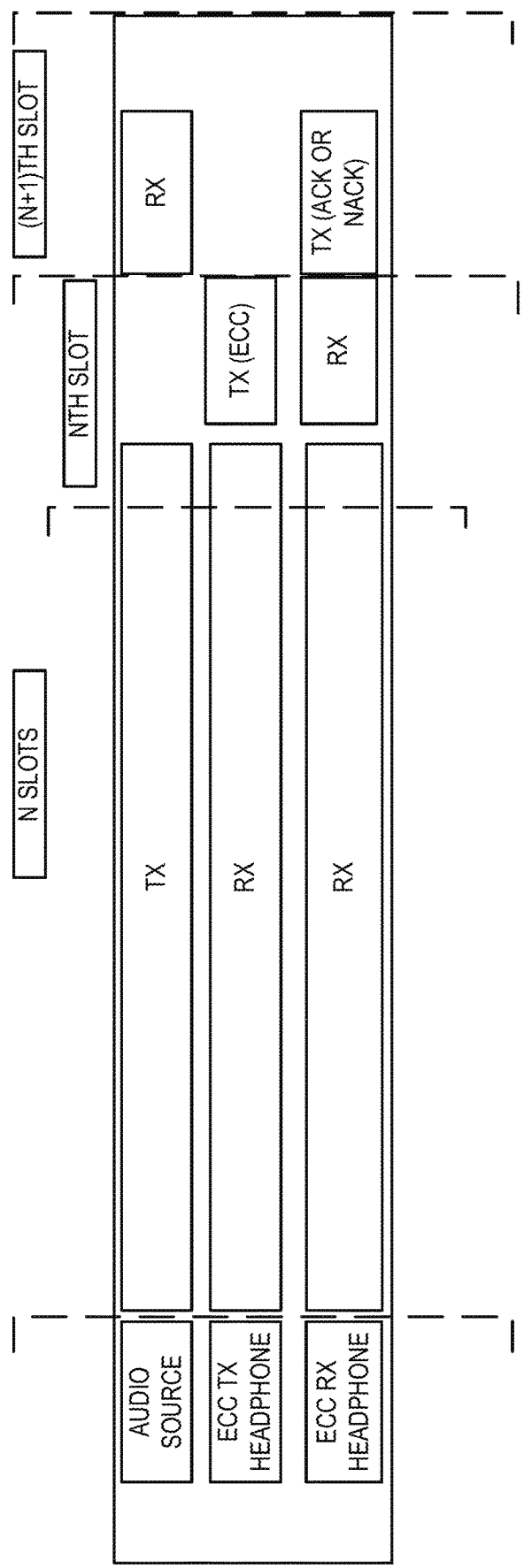

It is understood that in FIG. 4A, each audio data packet in transmitted within a single time slot, e.g., the first time slot (N), for example according to BLUETOOTH Hands Free Profile (HFP). In the time slot in which the audio data packet is transmitted by the audio source, the audio data packet and the error correcting message can share the same time slot. For example, the audio data packet may be transmitted prior to the error correcting message in the same time slot. In some embodiments, each audio data packet can be transmitted within multiple time slots, for example according to BLUETOOTH A2DP. As shown in FIG. 4B, the audio data packet is transmitted from the audio source to each of the ECC transmitting and receiving headphones in N slots, and the error correcting message or pseudo error correcting message is transmitted from the ECC transmitting headphone to the ECC receiving headphone at the end of the last one of N slots (Nth slot). That is, at least part of the audio data packet is transmitted in the same slot (Nth slot) as the error correcting message. Similar to the example in FIG. 4A, in a time slot immediately subsequent to the last one of N slots, e.g., (N+1)th slot, the ECC receiving headphone transmits an ACK message or a NACK message to the audio source as described above in detail.

It is further understood that in some embodiments, the error correcting message may be transmitted in more than one time slot. In the case in which the audio data packet and the error correcting message are transmitted in N time slots (e.g., 3 or 5 time slots), the specific numbers of time slots within the N time slots used for transmitting the respective audio data packet and the error correcting message are not limited as long as the audio data packet is transmitted prior to the error correcting message in the N time slots. Thus, the error correcting message may be transmitted in the in the last one or more time slots of the N time slots.

Figure 5A:
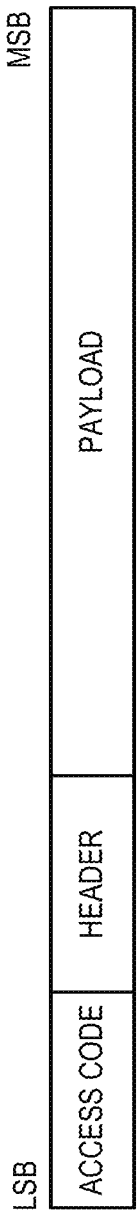
FIGS. 5A and 5B are depictions of exemplary BLUETOOTH audio data packets in accordance with an embodiment.
Figure 5B:
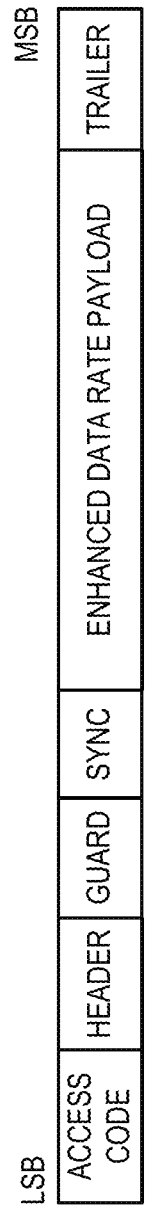
Figure 6:
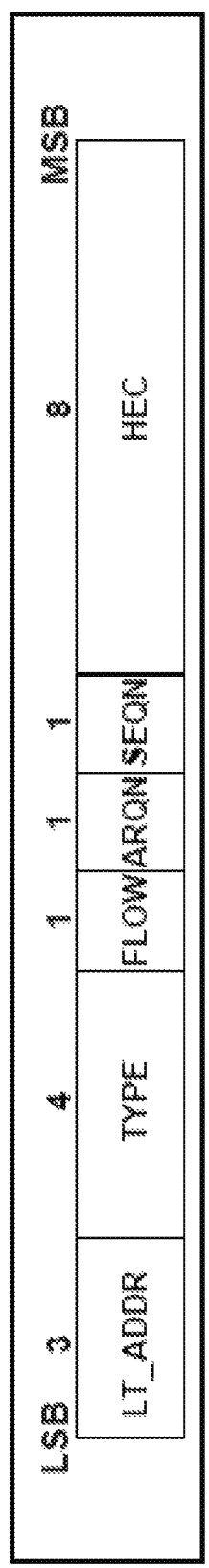
FIG. 6 is a depiction of a header of an exemplary packet in accordance with an embodiment.

In some embodiments, another type of error correcting message without an ECC may be transmitted from the ECC transmitting headphone to the ECC receiving headphone when the ECC transmitting headphone successfully receives the header of the audio data packet but fails to receive the payload of the audio data packet. FIGS. 5A and 5B are depictions of exemplary BLUETOOTH audio data packets in accordance with an embodiment. Both BLUETOOTH audio data packets in FIGS. 5A and 5B include an access code, a header, and a payload in which the actual audio information is coded. As described above, FIG. 6 illustrates an example of a header in a BLUETOOTH audio data packet. FIG. 5B illustrates an enhanced data rate BLUETOOTH audio data packet, which further includes guard, synchronization, and trailer fields. The payload of the enhanced data rate BLUETOOTH audio data packet may be transmitted at a higher symbol rate than the standard BLUETOOTH symbol rate by using different modulation technique (DPSK) than the header (GFSK). As described above, the ECC can be coded based on the actual audio information in the payload of a BLUETOOTH audio data packet using RS code, BCH code, etc.

Figure 4C:
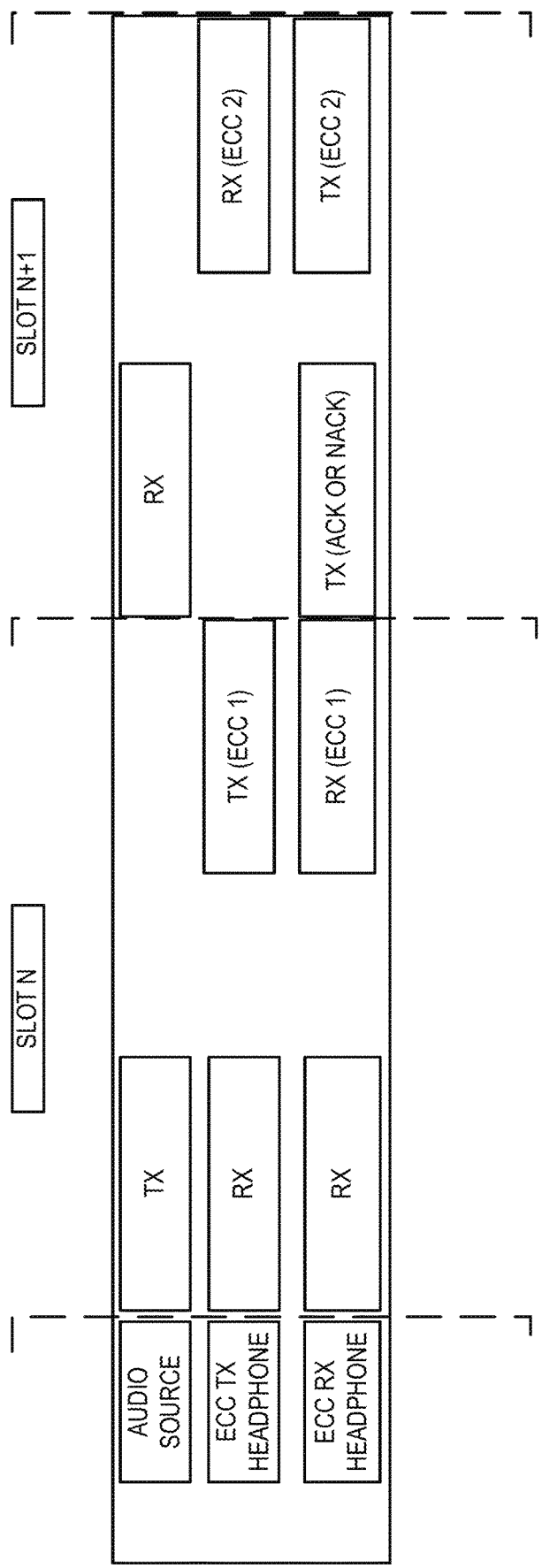

As shown in FIG. 4C, in a first time slot (N), if the ECC transmitting successfully receives the header of the audio data packet but fails to receive the payload of the audio data packet, it transmits a first error correcting message without an ECC to the ECC receiving headphone. In the second time slot (N+1) immediate subsequent to the first time slot (N), the ECC receiving headphone transmits a second error correcting message including an ECC generated by coding the payload of the audio data packet received by the ECC receiving headphone in the first time lot (N). By receiving the second error correcting message including the ECC, in the second time slot (N+1), the ECC transmitting headphone may correct the errors in the payload of the audio data packet. Similar to the example in FIG. 4A, in the second time slot (N+1), the ECC receiving headphone transmits an ACK message or a NACK message to the audio source as described above in detail. It is understood that although FIG. 4C shows the transmission of an audio data packet in a single time slot, the scheme can be expanded to situations in which the audio data packet is transmitted over multiple time slots, for example according to BLUETOOTH A2DP as described above with respect to FIG. 4B.

Figure 4D:
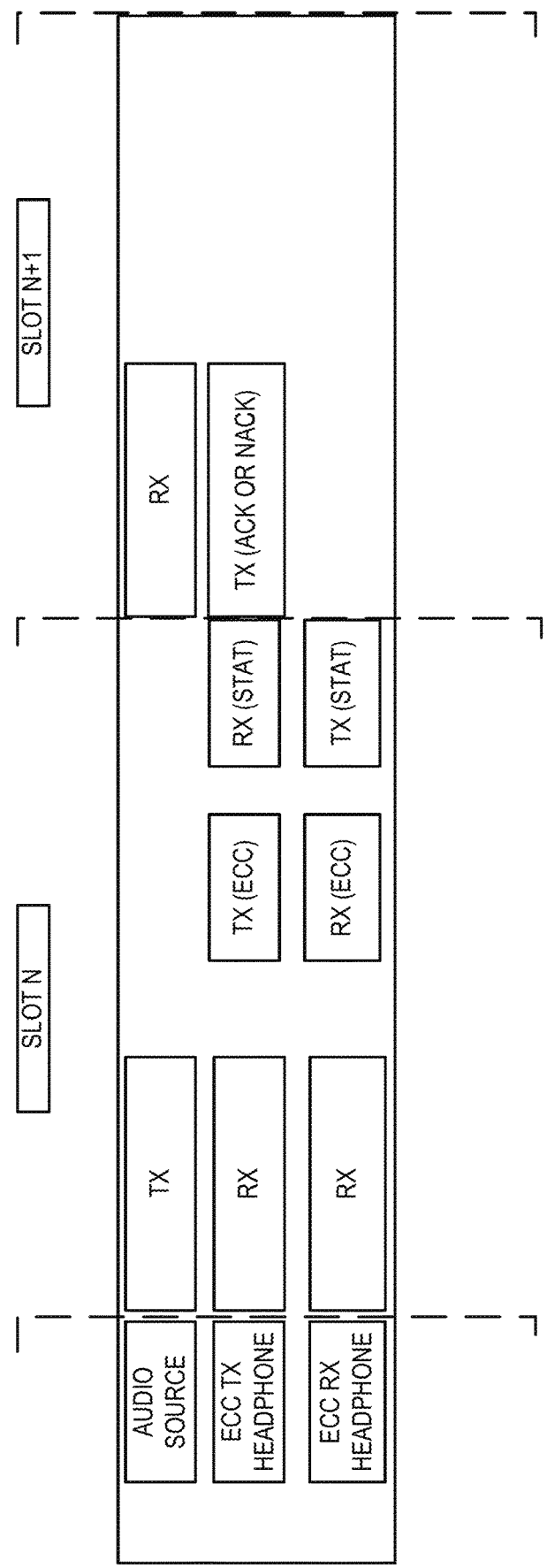
Figure 4E:
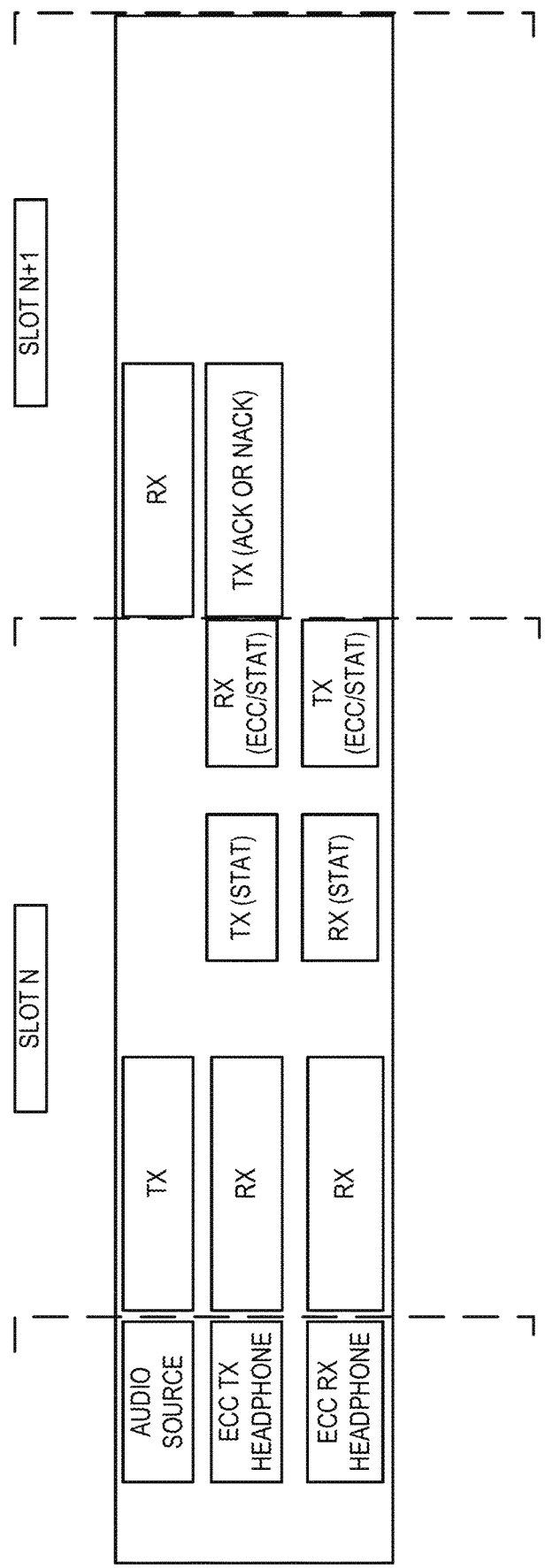

FIGS. 4D and 4E are timing diagrams of an exemplary wireless audio system implemented in another schedule. In this example, the ECC transmitting headphone, as opposed to the ECC receiving headphone, transmits the ACK or NACK message to the audio source. As shown in FIG. 4D, in the first time slot (N), the ECC transmitting headphone successfully receives the audio data packet and thus, transmits an error correcting message including an ECC in the same time slot (N) to the ECC receiving headphone. In the same time slot (N), the ECC receiving headphone transmits a status message (STAT) to the ECC transmitting headphone, which indicates whether the ECC receiving headphone successfully receives the audio data packet based on the ECC received from the ECC transmitting headphone. For example, the status message may indicate that the reception of the audio data packet at the ECC receiving headphone is successfully either because no error is found at the first place or the error has been corrected using the ECC. The status message may indicate that reception of the audio data packet at the ECC receiving headphone is unsuccessfully even after the correction using the ECC. In the immediately subsequent slot (N+1), the ECC transmitting headphone transmits an ACK message or a NACK message to the audio source based on the status message received from the ECC receiving headphone.

As shown in FIG. 4E, in the first time slot (N), the ECC transmitting headphone does not successfully receive the audio data packet and thus, transmits a status message indicative of such failure to the ECC receiving headphone. In the same time slot (N), the ECC receiving headphone may transmit an error correcting message including an ECC if it successfully receives the audio data packet or a status message indicative of its failure to successfully receive the audio data packet to the ECC transmitting headphone. If the ECC transmitting headphone receives the error correcting message including the ECC from the ECC receiving headphone in the first time slot (N) and corrects the audio data packet based on the ECC, then in the immediate subsequent time slot (N+1), the ECC transmitting headphone transmits an ACK message to the audio source. If the ECC transmitting headphone receives the error correcting message including the ECC but fails to correct the audio data packet based on the ECC or if the ECC transmitting headphone receives the status message indicative of the ECC receiving headphone's failure to successfully receive the audio data packet, then in the immediate subsequent time slot (N+1), the ECC transmitting headphone transmits a NACK message to the audio source.

It is understood that although FIGS. 4D and 4E show the transmission of an audio data packet in a single time slot, the scheme can be expanded to situations in which the audio data packet is transmitted over multiple time slots, for example according to BLUETOOTH A2DP as described above with respect to FIG. 4B. In some embodiments, each time slot may be a standard BLUETOOTH time slot having the same duration (e.g., 625 μs), and the messages described in FIGS. 4D and 4E are communicated using WiFi communication such that multiple messages can be communicated in a single standard BLUETOOTH time slot.

Figure 7:
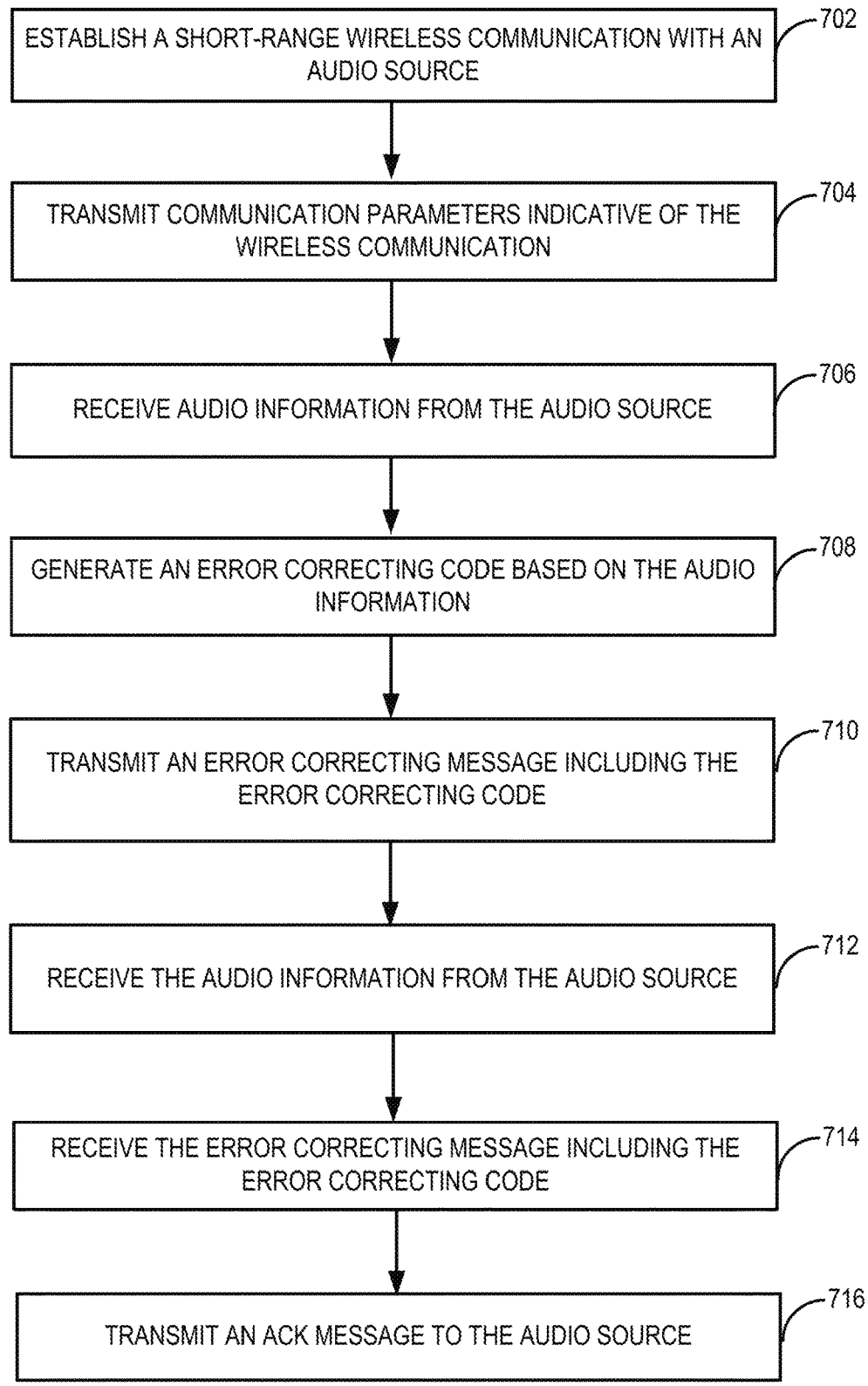
FIG. 7 is a flow chart illustrating an exemplary method for wirelessly communicating audio information in accordance with an embodiment.

FIG. 7 is a flow chart illustrating an exemplary method 700 for wirelessly communicating audio information in accordance with an embodiment. Method 700 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 7, as will be understood by a person of ordinary skill in the art.

Method 700 shall be described with reference to FIGS. 1A, 1B, and 2. However, method 700 is not limited to that exemplary embodiment. Starting at 702, a first type of short-range wireless communication, such as BLUETOOTH communication, is established with an audio source. In some embodiments, the short-range wireless communication is established between primary wireless headphone 104 and audio source 102. At 704, communication parameters indicative of the short-range wireless communication are transmitted. In some embodiments, the communication parameters are transmitted from primary wireless headphone 104 to secondary wireless headphone 106 using the first type of short-range wireless communication, such as BLUETOOTH communication, or a second type of short-range wireless communication, such as WiFi communication or NFMI communication.

At 706, audio information is received by an ECC transmitting headphone from the audio source using the first type of short-range wireless communication, such as BLUETOOTH communication. In some embodiments, the ECC transmitting headphone is primary wireless headphone 104, and the audio information is received by primary wireless headphone 104 via the normal communication link. In some embodiments, the ECC transmitting headphone is secondary wireless headphone 106, and the audio information is snooped by secondary wireless headphone 106 via the snoop communication link.

At 708, an ECC is generated by the ECC transmitting headphone based on the audio information received by the ECC transmitting headphone in response to successfully receiving the audio information. The audio information may include a BLUETOOTH audio data packet, and the error correcting code may be generated by coding a payload of the BLUETOOTH audio data packet. In some embodiments, control module 220 of primary wireless headphone 104 controls the coding of the payload when primary wireless headphone 104 is the ECC transmitting headphone. In some embodiments, control module 234 of secondary wireless headphone 106 controls the coding of the payload when secondary wireless headphone 106 is the ECC transmitting headphone.

At 710, an error correcting message including the ECC is transmitted by the ECC transmitting headphone. The error correcting message may be transmitted based on a standard BLUETOOTH protocol in network layers above a physical layer and transmitted at a higher symbol rate than the standard BLUETOOTH protocol in the physical layer. The error correcting message may be transmitted using a second type of short-range wireless communication different from the first type of short-range wireless communication for transmitting the audio information. For example, the first type of short-range wireless communication is BLUETOOTH communication, and the second type of short-range wireless communication is WiFi communication or NFMI communication. In one example, a BLUETOOTH audio data packet and the error correcting message are transmitted in the same time slot subsequently. In another example, a BLUETOOTH audio data packet is transmitted over multiple time slots, and the error correcting message is transmitted at the end of the last one or more of the multiple time slots. In some embodiments, second RF module 212 of primary wireless headphone 104 transmits the error correcting message when primary wireless headphone 104 is the ECC transmitting headphone. In some embodiments, second RF module 226 of secondary wireless headphone 106 transmits the error correcting message when secondary wireless headphone 106 is the ECC transmitting headphone.

At 712, the audio information is received by the ECC receiving headphone from the audio source using the first type of short-range wireless communication, such as BLUETOOTH communication. In some embodiments, the ECC receiving headphone is primary wireless headphone 104, and the audio information is received by primary wireless headphone 104 via the normal communication link. In some embodiments, the ECC receiving headphone is secondary wireless headphone 106, and the audio information is snooped by secondary wireless headphone 106 via the snoop communication link.

At 714, the error message including the ECC is received by the ECC receiving headphone from the ECC transmitting headphone, for example, using the first type of short-range wireless communication, such as WiFi communication or NFMI communication. In some embodiments, the audio information received from the audio source at 712 is corrected based on the error correcting code by the ECC receiving headphone if the ECC receiving headphones detect error(s) in the audio information. The ECC receiving headphone then can successfully receive the audio information after the correction. In some embodiments, second RF module 212 of primary wireless headphone 104 receives the error correcting message when primary wireless headphone 104 is the ECC receiving headphone. In some embodiments, second RF module 226 of secondary wireless headphone 106 receives the error correcting message when secondary wireless headphone 106 is the ECC receiving headphone.

At 716, in response to successfully receiving the audio information from the audio source based on the error correcting code, an ACK message is transmitted to the audio source by the ECC receiving headphone. The ACK message may be transmitted in a time slot that is immediately subsequent to the time slot in which the error correcting message is transmitted and received. In some embodiments, first RF module 210 of primary wireless headphone 104 transmits the ACK message when primary wireless headphone 104 is the ECC receiving headphone. In some embodiments, first RF module 224 of secondary wireless headphone 106 transmits the ACK message when secondary wireless headphone 106 is the ECC receiving headphone.

Figure 8:
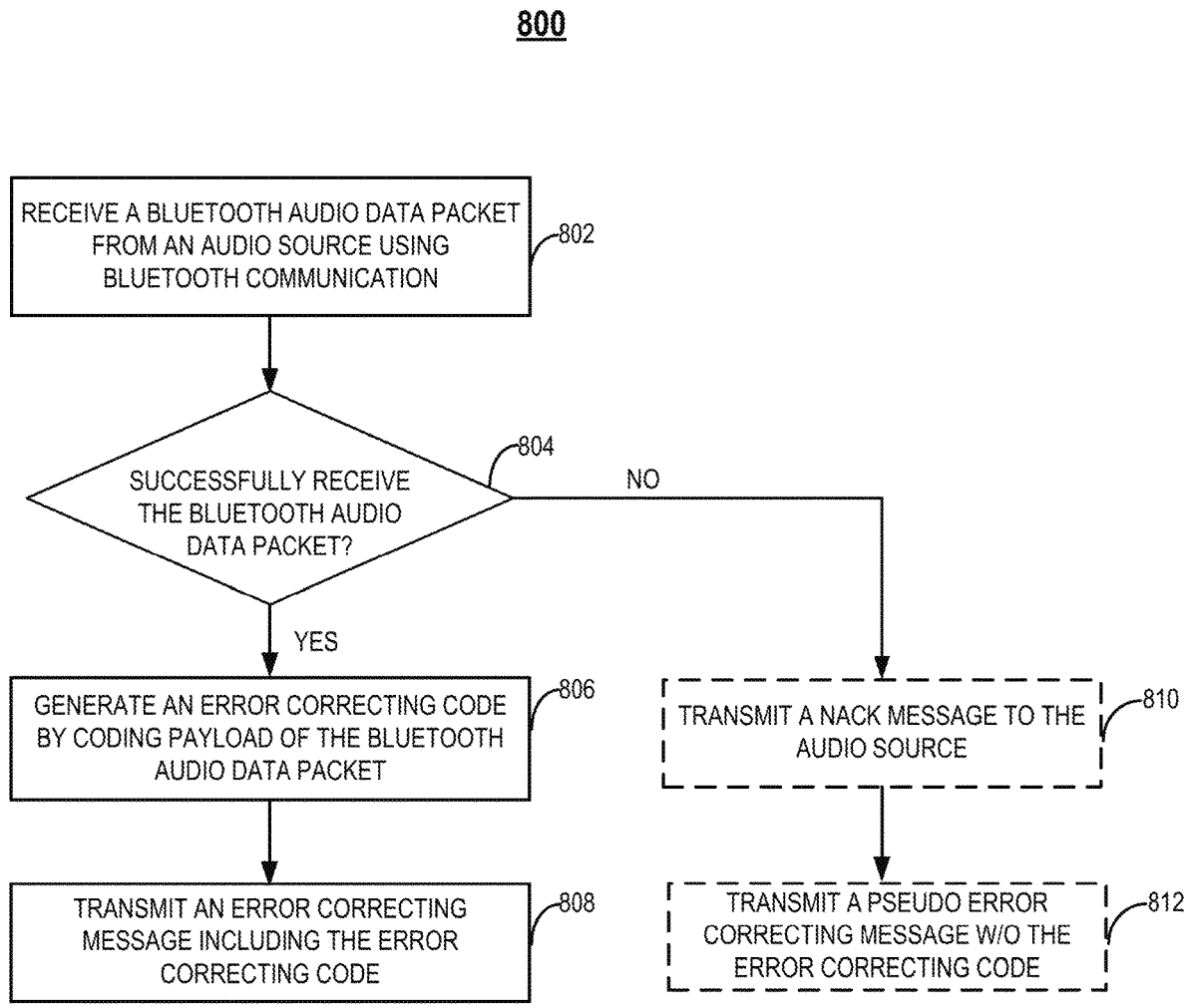
FIG. 8 is a flow chart illustrating another exemplary method for wirelessly communicating audio information in accordance with an embodiment.

FIG. 8 is a flow chart illustrating another exemplary method 800 for wirelessly communicating audio information in accordance with an embodiment. Method 800 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 8, as will be understood by a person of ordinary skill in the art.

Method 800 may be performed by an ECC transmitting headphone disclosed herein regardless of whether it is primary wireless headphone 104 or secondary wireless headphone 106. Starting at 802, the ECC transmitting headphone receives a BLUETOOTH audio data packet from an audio source using BLUETOOTH communication in one or more time slots. At 804, the ECC transmitting headphone determines whether the BLUETOOTH audio data packet is successfully received. If the answer is yes, method 800 proceeds to 806 at which the ECC transmitting headphone generates an ECC by coding the payload of the BLUETOOTH audio data packet. At 808, the ECC transmitting headphone transmits an error correcting message including the ECC to an ECC receiving headphone in the last time slot in which the BLUETOOTH audio data packet is received. If the answer at 804 is no, method 800 proceeds to 810 at which the ECC transmitting headphone transmits a NACK message to the audio source. Alternatively or additionally, at 812, the ECC transmitting headphone transmits a pseudo error correcting message without the ECC to the ECC receiving headphone.

Figure 9:
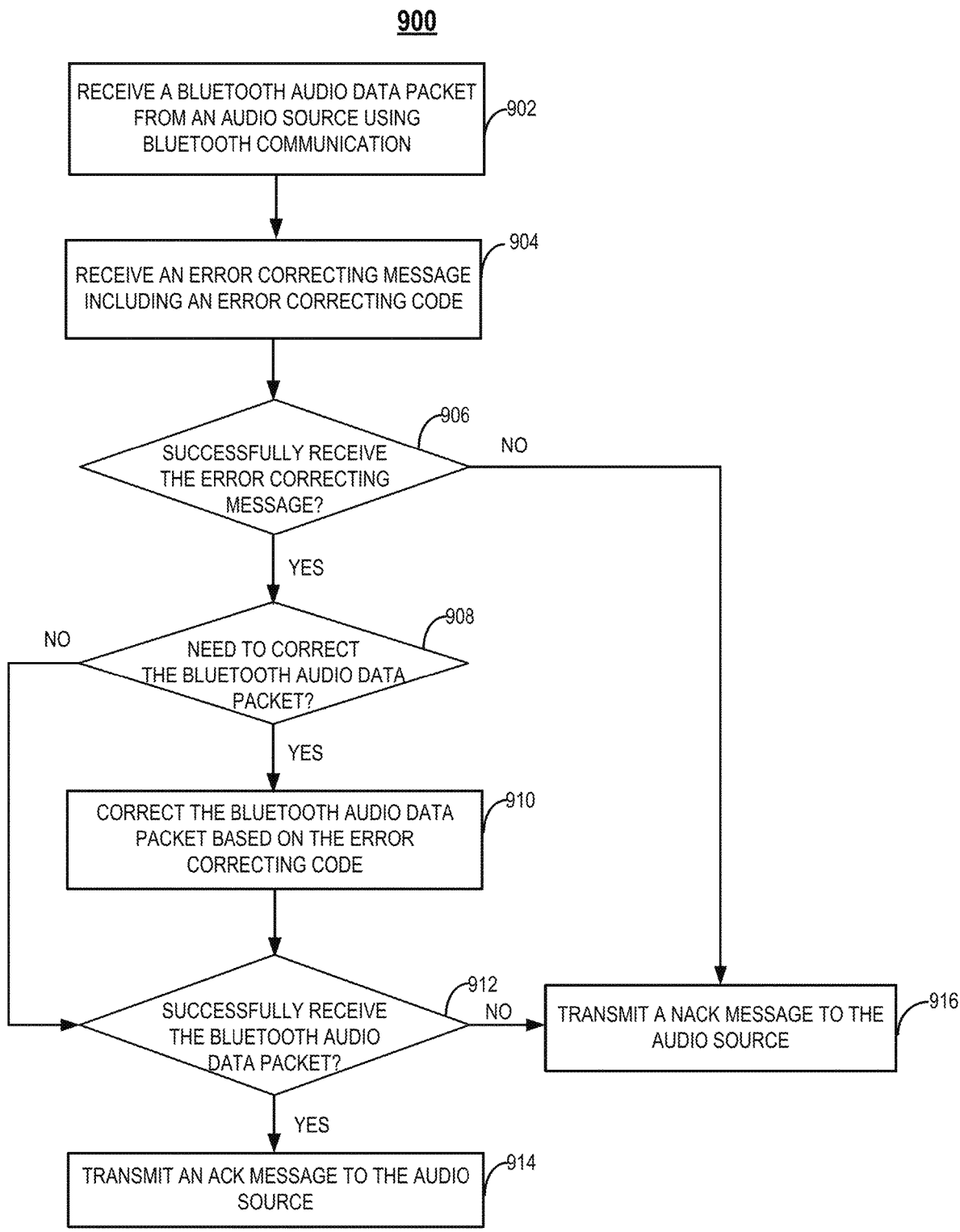
FIG. 9 is a flow chart illustrating still another exemplary method for wirelessly communicating audio information in accordance with an embodiment.

FIG. 9 is a flow chart illustrating still another exemplary method 900 for wirelessly communicating audio information in accordance with an embodiment. Method 900 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 9, as will be understood by a person of ordinary skill in the art.

Method 900 may be performed by an ECC receiving headphone disclosed herein regardless of whether it is primary wireless headphone 104 or secondary wireless headphone 106. Starting at 902, the ECC receiving headphone receives a BLUETOOTH audio data packet from an audio source using Bluetooth communication in one or more time slots. At 904, the ECC receiving headphone receives an error correcting message including an ECC in the last time slot in which the BLUETOOTH audio data packet is received. At 906, the ECC receiving headphone determines whether the error correcting message including the ECC is successfully received. If the answer is yes, method 900 proceeds to 908 at which the ECC receiving headphone determines whether the BLUETOOTH audio data packet needs to be corrected (e.g., containing errors in the payload). If the answer is yes, at 910, the ECC receiving headphone corrects the BLUETOOTH audio data packet based on the ECC. If the answer is no at 908, method 900 proceeds to 912 directly at which the ECC receiving headphone determines whether the BLUETOOTH audio data packet is successfully received. It is understood that the answer at 912 can be yes either when the BLUETOOTH audio data packet needs to be corrected at 908 and is corrected after 910 or can be yes when the BLUETOOTH audio data packet does not need to be corrected at 908. Nevertheless, at 914, the ECC receiving headphone transmits an ACK message to the audio source in a time slot immediately subsequent to the time slot in which the error correcting message is received when the answer at 912 is yes. Otherwise, method 900 proceeds to 916 at which the ECC receiving headphone transmits a NACK message to the audio source in the immediately subsequent time slot. Also, if the answer at 906 is no, i.e., the ECC receiving headphone does not successfully receive the error correcting message including the ECC from the ECC transmitting headphone (e.g., not receiving any error correcting message at all or receiving a pseudo error correcting message without an ECC), method 900 proceeds to 916 directly at which the ECC receiving headphone transmits the NACK message to the audio source.

Figure 10:
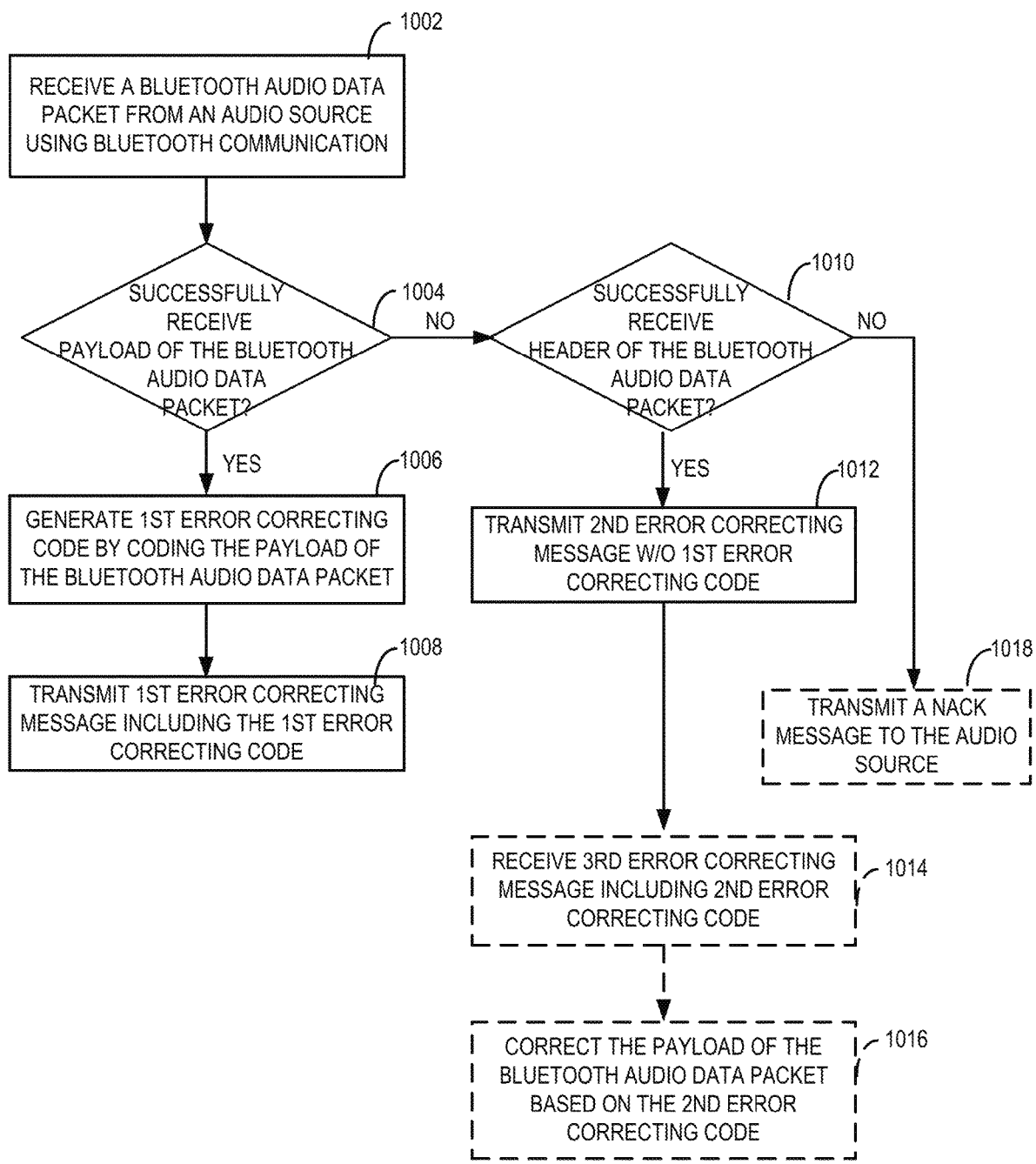
FIG. 10 is a flow chart illustrating yet another exemplary method for wirelessly communicating audio information in accordance with an embodiment.

FIG. 10 is a flow chart illustrating yet another exemplary method 1000 for wirelessly communicating audio information in accordance with an embodiment. Method 1000 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 10, as will be understood by a person of ordinary skill in the art.

Method 1000 may be performed by an ECC transmitting headphone disclosed herein regardless of whether it is primary wireless headphone 104 or secondary wireless headphone 106. Method 800 may be implemented for the examples disclosed in FIGS. 1C, 1D, and 4C. Starting at 1002, the ECC transmitting headphone receives a BLUETOOTH audio data packet from an audio source using BLUETOOTH communication in one or more time slots. At 1004, the ECC transmitting headphone determines whether the payload of the BLUETOOTH audio data packet is successfully received. If the answer is yes, method 1000 proceeds to 1006 at which the ECC transmitting headphone generates a first ECC by coding the payload of the BLUETOOTH audio data packet. At 1008, the ECC transmitting headphone transmits a first error correcting message including the first ECC to an ECC receiving headphone in the last one or more time slots in which the BLUETOOTH audio data packet is received. If the answer at 1004 is no, method 1000 proceeds to 1010 at which the ECC transmitting headphone determines whether the header of the BLUETOOTH audio data packet is successfully received. If the answer at 1010 is yes, method 1000 proceeds to 1012 at which a second error correcting message without the first ECC is transmitted to the ECC receiving headphone in the last one or more time slots in which the BLUETOOTH audio data packet is received.

In some cases, method 1000 may proceed to 1014 at which the ECC transmitting headphone receives a third error correcting message including a second ECC from the ECC receiving headphone in the immediately subsequent time slot. The second ECC may be generated by coding the payload of the BLUETOOTH audio data packet that is successfully received by the ECC receiving headphone in the same one or more time slots in which the ECC transmitting headphone receives the BLUETOOTH audio data packet. In some embodiments, the header may be transmitted with the second error correcting message from the ECC transmitting headphone to the ECC receiving headphone to match the BLUETOOTH audio data packets received by the ECC transmitting and receiving headphones, respectively. At 1016, the ECC transmitting headphone may correct the payload of the BLUETOOTH audio data packet based on the second ECC generated by the ECC receiving headphone. Optionally, if the answer at 1010 is no, i.e., the ECC transmitting headphone successfully receives neither the payload nor the header of the BLUETOOTH audio data packet, at 1018, the ECC transmitting headphone transmits a NACK message to the audio source.

Figure 11:
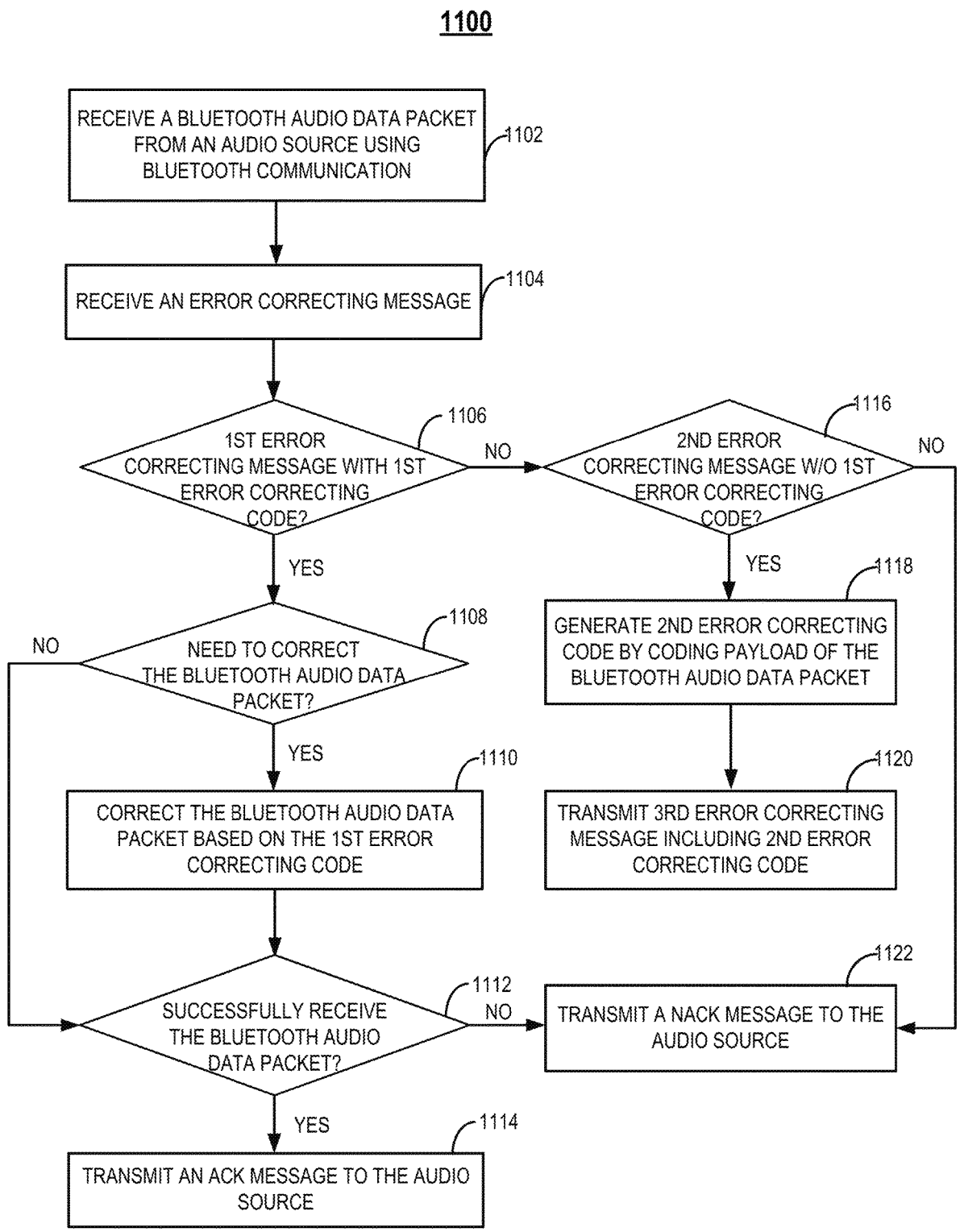
FIG. 11 is a flow chart illustrating yet another exemplary method for wirelessly communicating audio information in accordance with an embodiment.

FIG. 11 is a flow chart illustrating yet another exemplary method 1100 for wirelessly communicating audio information in accordance with an embodiment. Method 1100 can be performed by processing logic that can comprise hardware (e.g., circuitry, dedicated logic, programmable logic, microcode, etc.), software (e.g., instructions executing on a processing device), or a combination thereof. It is to be appreciated that not all operations may be needed to perform the disclosure provided herein. Further, some of the operations may be performed simultaneously, or in a different order than shown in FIG. 11, as will be understood by a person of ordinary skill in the art.

Method 1100 may be performed by an ECC receiving headphone disclosed herein regardless of whether it is primary wireless headphone 104 or secondary wireless headphone 106. Method 1100 may be implemented for the examples disclosed in FIGS. 1C, 1D, and 4C. Starting at 1102, the ECC receiving headphone receives a BLUETOOTH audio data packet from an audio source using BLUETOOTH communication in one or more time slots. At 1104, the ECC receiving headphone receives an error correcting message in the last one or more time slots in which the BLUETOOTH audio data packet is received. At 1106, the ECC receiving headphone determines whether the received error correcting message is the first error correcting message including the first ECC. If the answer is yes, method 1100 proceeds to 1109 at which the ECC receiving headphone determines whether the BLUETOOTH audio data packet needs to be corrected. If the answer at 1108 is yes, method 1100 proceeds to 1110 at which the ECC receiving headphone corrects the BLUETOOTH audio data packet based on the first ECC. At 1112, the ECC receiving headphone determines whether the BLUETOOTH audio data packet is successfully received either directly after 1108 without correction or after the correction at 1110. If the answer at 1112 is yes, method proceeds to 1114 at which the ECC receiving headphone transmits an ACK message to the audio source in the immediately subsequent time slot. Otherwise, method proceeds to 1122 at which the ECC receiving headphone transmits a NACK message to the audio source in the immediately subsequent time slot.

Back to 1106, if the answer is no, the ECC receiving headphone determines whether the received error correcting message is the second error correcting message without the first ECC, which indicates that the ECC transmitting headphone successfully receives the header of the BLUETOOTH audio data packet but not the payload. If the answer at 1116 is yes, the ECC receiving headphone generates the second ECC by coding the payload of the BLUETOOTH audio data packet successfully received at 1118. In some embodiments, the header may be transmitted with the second error correcting message from the ECC transmitting headphone to the ECC receiving headphone to match the BLUETOOTH audio data packets received by the ECC transmitting and receiving headphones, respectively. At 1120, the ECC receiving headphone transmits a third error correcting message including the second ECC to the ECC transmitting headphone in the immediately subsequent time slot. Also, if the answer at 1116 is no, i.e., the ECC receiving headphone receives neither the first error correcting message nor the second error correcting message, method 1116 proceeds to 1122 directly at which the ECC receiving headphone transmits the NACK message to the audio source in the immediately subsequent time slot.

It is understood that all the error correcting messages disclosed herein may be replaced with the actual audio information, e.g., the payload of the audio data packet without coding, in some embodiments. In other words, instead of generating the ECC by coding the payload of an audio data packet and transmitting an error correcting message including the ECC, the ECC transmitting headphone may transmit a message including the payload of the audio data packet without ECC coding.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure or the appended claims in any way.

While the present disclosure has been described herein with reference to exemplary embodiments for exemplary fields and applications, it should be understood that the present disclosure is not limited thereto. Other embodiments and modifications thereto are possible, and are within the scope and spirit of the present disclosure. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

The breadth and scope of the present disclosure should not be limited by any of the above-described exemplary embodiments, but should be defined only in accordance with the following claims and their equivalents.

What is claimed is:
1. A wireless audio system, comprising:
a first wireless headphone configured to:
    receive, from an audio source, audio information using a first type of short-range wireless communication; and
    in response to successfully receiving the audio information from the audio source, transmit an audio information message including the audio information using a second type of short-range wireless communication different from the first type of short-range wireless communication; and
a second wireless headphone configured to:
    receive, from the audio source, the audio information using the first type of short-range wireless communication;
    receive, from the first wireless headphone, the audio information message using the second type of short-range wireless communication; and
    in response to at least one of (i) successfully receiving the audio information from the audio source and the first wireless headphone successfully receiving the audio information from the audio source, or (ii) successfully receiving the audio information message from the first wireless headphone, transmit an acknowledgement (ACK) message to the audio source, wherein:
the first type of short-range wireless communication is based on a plurality of time slots with a same duration;
the first wireless headphone is further configured to receive the audio information from the audio source and transmit the audio information message to the second wireless headphone in a same first time slot; and
the second wireless headphone is further configured to receive the audio information from the audio source in the first time slot and transmit the ACK message to the audio source in a second time slot, immediately subsequent to the first time slot.

2. The wireless audio system of claim 1, wherein the second wireless headphone is further configured to, in response to at least one of (i) not successfully receiving the audio information from the audio source, and not successfully receiving the audio information message from the first wireless headphone, or (ii) the first wireless headphone not successfully receiving the audio information from the audio source, transmit a negative acknowledgement (NACK) message to the audio source in the second time slot.

3. The wireless audio system of claim 1, wherein the first type of short-range wireless communication is BLUETOOTH communication, and the second type of short-range wireless communication is Wi-Fi communication or near-field magnetic induction (NFMI) communication.

4. The wireless audio system of claim 1, wherein one of the first and second wireless headphones works in a snoop mode to communicate with the audio source based on communication parameters of another one of the first and second wireless headphones.

5. The wireless audio system of claim 4, wherein the first wireless headphone is in the snoop mode, and the second wireless headphone is further configured to:
    establish the first type of short-range wireless communication with the audio source; and
    transmit, to the first wireless headphone, the communication parameters indicative of the first type of short-range wireless communication between the second wireless headphone and the audio source.

6. The wireless audio system of claim 4, wherein the second wireless headphone is in the snoop mode, and the first wireless headphone is further configured to:
establish the first type of short-range wireless communication with the audio source; and
transmit, to the second wireless headphone, the communication parameters indicative of the first type of short-range wireless communication between the first wireless headphone and the audio source.

7. The wireless audio system of claim 1, wherein the first and second wireless headphones are configured to be dynamically switched based on a signal quality of each of the first and second wireless headphones.

8. The wireless audio system of claim 1, wherein a signal quality of the first wireless headphone is better than a signal quality of the second wireless headphone.

9. A method for wirelessly communicating audio information, comprising:
receiving, by a first wireless headphone, audio information from an audio source using a first type of short-range wireless communication;
in response to successfully receiving the audio information from the audio source, transmitting, by the first wireless headphone, an audio information message including the audio information using a second type of short-range wireless communication different from the first type of shot-range wireless communication;
receiving, by a second wireless headphone, the audio information from the audio source using the first type of short-range wireless communication;
receiving, by the second wireless headphone, the audio information message from the first wireless headphone using the second type of short-range wireless communication; and
in response to at least one of in response to at least one of (i) successfully receiving the audio information from the audio source and the first wireless headphone successfully receiving the audio information from the audio source, or (ii) successfully receiving the audio information message from the first wireless headphone, transmitting, by the second wireless headphone, an acknowledgement (ACK) message to the audio source, wherein:
the first type of short-range wireless communication is based on a plurality of time slots with a same duration;
the audio information is received from the audio source and the audio information message is transmitted to the second wireless headphone in a same first time slot, by the first wireless headphone; and
the audio information is received from the audio source in the first time slot and the ACK message is transmitted to the audio source in a second time slot, immediately subsequent to the first time slot, by the second wireless headphone.

10. The method of claim 9, further comprising:
in response to at least one of (i) not successfully receiving the audio information from the audio source, and not successfully receiving the audio information message from the first wireless headphone, or (ii) the first wireless headphone not successfully receiving the audio information from the audio source, transmitting a negative acknowledgement (NACK) message to the audio source in the second time slot, by the second wireless headphone.

11. The method of claim 10, wherein the first type of short-range wireless communication is BLUETOOTH communication, and the second type of short-range wireless communication is Wi-Fi communication or near-field magnetic induction (NFMI) communication.

12. The method of claim 11, further comprising:
dynamically switching the first and second wireless headphones based on a signal quality of each of the first and second wireless headphones.

13. The method of claim 10, wherein one of the first and second wireless headphones works in a snoop mode to communicate with the audio source based on communication parameters of another one of the first and second wireless headphones.

14. The method of claim 13, further comprising:
establishing, by the first wireless headphone, the first type of short-range wireless communication with the audio source; and
transmitting, by the first wireless headphone, communication parameters indicative of the first type of short-range wireless communication to the second wireless headphone,
wherein receiving, by the second wireless headphone, the audio information comprises snooping, by the second wireless headphone, the audio information from the audio source based on the communication parameters.

15. A wireless audio system, comprising:
a first wireless headphone configured to:
receive, from an audio source, a BLUETOOTH audio data packet corresponding to an audio information from an audio source using BLUETOOTH communication; and
in response to successfully receiving the audio information from the audio source, transmit an audio information message including the audio information using a second type of short-range wireless communication different from the BLUETOOTH communication; and
a second wireless headphone configured to:
receive, from the audio source, the BLUETOOTH audio data using the BLUETOOTH communication;
receive, from the first wireless headphone, the audio information message using the second type of short-range wireless communication; and
in response to at least one of (i) successfully receiving the BLUETOOTH audio data packet from the audio source and the first wireless headphone successfully receiving the BLUETOOTH audio data packet from the audio source, or (ii) successfully receiving the audio information message from the first wireless headphone, transmit an acknowledgement (ACK) message to the audio source, wherein:
the first wireless headphone is further configured to receive the BLUETOOTH audio data packet from the audio source and transmit the audio information message to the second wireless headphone in a same first time slot; and
the second wireless headphone is further configured to receive the BLUETOOTH audio data packet from the audio source in the first time slot and transmit the ACK message to the audio source in a second time slot, immediately subsequent to the first time slot.

16. The wireless audio system of claim 15, wherein the second wireless headphone is further configured to, in response to at least one of (i) not successfully receiving the BLUETOOTH audio data packet from the audio source, and not successfully receiving the audio information message from the first wireless headphone, or (ii) the first wireless headphone not successfully receiving the BLUETOOTH audio data packet from the audio source, transmit a negative acknowledgement (NACK) message to the audio source in the second time slot.

17. The wireless audio system of claim 15, wherein the second type of short-range wireless communication is Wi-Fi communication or near-field magnetic induction (NFMI) communication.

18. The wireless audio system of claim 15, wherein one of the first and second wireless headphones works in a snoop mode to communicate with the audio source based on communication parameters of another one of the first and second wireless headphones.

19. The wireless audio system of claim 18, wherein the second wireless headphone is in the snoop mode, and the first wireless headphone is further configured to:
   establish the BLUETOOTH communication with the audio source; and
   transmit, to the second wireless headphone, the communication parameters indicative of the BLUETOOTH communication between the first wireless headphone and the audio source.

20. A method for wirelessly communicating BLUETOOTH audio information, comprising:
   receiving a BLUETOOTH audio data packet corresponding to an audio information from an audio source using BLUETOOTH communication, wherein the BLUETOOTH audio data packet is received in a first time slot;
   receiving, from a wireless headphone using WiFi communication, an audio information message including the audio information, in the first time slot; and
   in response to at least one of (i) successfully receiving the BLUETOOTH audio data packet from the audio source and the first wireless headphone successfully receiving the BLUETOOTH audio data packet from the audio source, or (ii) successfully receiving the audio information message from the first wireless headphone, transmitting an acknowledgement (ACK) message to the audio source, in a second time slot, subsequent to the first time slot.

\* \* \* \* \*